United States Patent [19]

Hug et al.

[11] 4,236,301

[45] Dec. 2, 1980

[54] APPARATUS FOR MOUNTING DEVICES ON A SUBSTRATE

[75] Inventors: Joseph Hug, Ormesson; Pierre Sigel, Villeneuve-le-Roi; Raymond Delorme, Bagnolet; Maurice DeVoille, Sevran; Henri Grosjean, Le Plessis Trevise, all of France

[73] Assignee: Compagnie Internationale pour l'Informatique, Paris, France

[21] Appl. No.: 966,318

[22] Filed: Dec. 4, 1978

Related U.S. Application Data

[62] Division of Ser. No. 874,652, Feb. 2, 1978.

[30] Foreign Application Priority Data

Feb. 4, 1977 [FR] France .................. 77 03271

[51] Int. Cl.³ .................. B23P 21/00; B23P 23/00
[52] U.S. Cl. .................. 29/740; 29/759; 29/704; 29/564.6; 29/741; 83/62.1
[58] Field of Search .............. 29/740, 741, 704, 564.6, 29/564.7, 759; 228/6 A, 5.1, 170; 83/62, 62.1

[56] References Cited

U.S. PATENT DOCUMENTS

| | | |
|---|---|---|
| 3,412,451 | 11/1968 | Vieser et al. .................. 29/407 |
| 3,508,315 | 4/1970 | Hoffken .................. 29/741 |
| 3,597,824 | 8/1971 | Yoshida et al. .................. 29/564.6 |
| 3,710,479 | 1/1973 | Bernardo et al. .................. 29/741 |
| 3,735,911 | 5/1973 | Ward .................. 228/6 A |
| 3,742,574 | 7/1973 | Bennett et al. .................. 29/706 |
| 3,744,361 | 7/1973 | Van Doorn et al. .................. 83/62 |
| 3,765,075 | 10/1973 | Olney, Jr. et al. .................. 29/739 |
| 3,777,350 | 12/1973 | Maeda et al. .................. 29/564.6 |
| 3,783,488 | 1/1974 | Ragard et al. .................. 29/741 |
| 3,887,783 | 6/1975 | Comette .................. 228/170 |
| 3,893,232 | 7/1975 | Fletcher et al. .................. 29/741 |
| 4,051,593 | 10/1977 | Mori et al. .................. 29/564.6 |
| 4,080,730 | 3/1978 | Woodman, Jr. .................. 29/741 |

Primary Examiner—Daniel C. Crane
Attorney, Agent, or Firm—Kerkam, Stowell, Kondracki & Clarke

[57] ABSTRACT

The invention relates to a method and apparatus which is intended to equip a support substrate with integrated circuit devices of different kinds mounted originally on films. The apparatus includes a machine having cutting heads each associated with the film, and soldering heads. The substrate is mounted on a plate which is movable on a table in a direction perpendicular to the movement of the table, which movement takes place on a threaded spindle drive by a motor. The operation of the machine is monitored and controlled by a unit such as a computer. The invention is applicable in particular to mounting such devices on substrates intended for data-processing assemblies.

17 Claims, 37 Drawing Figures

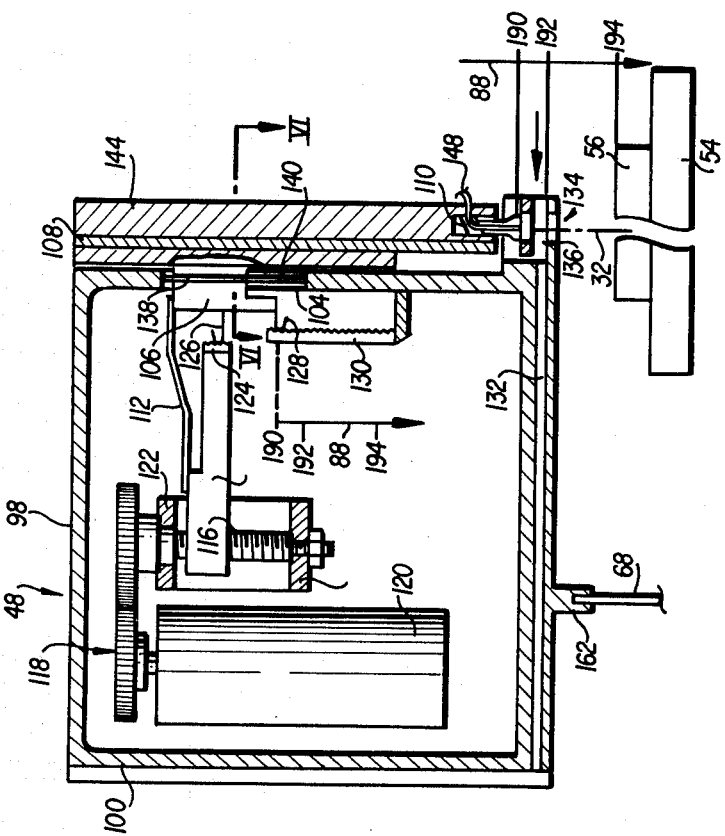
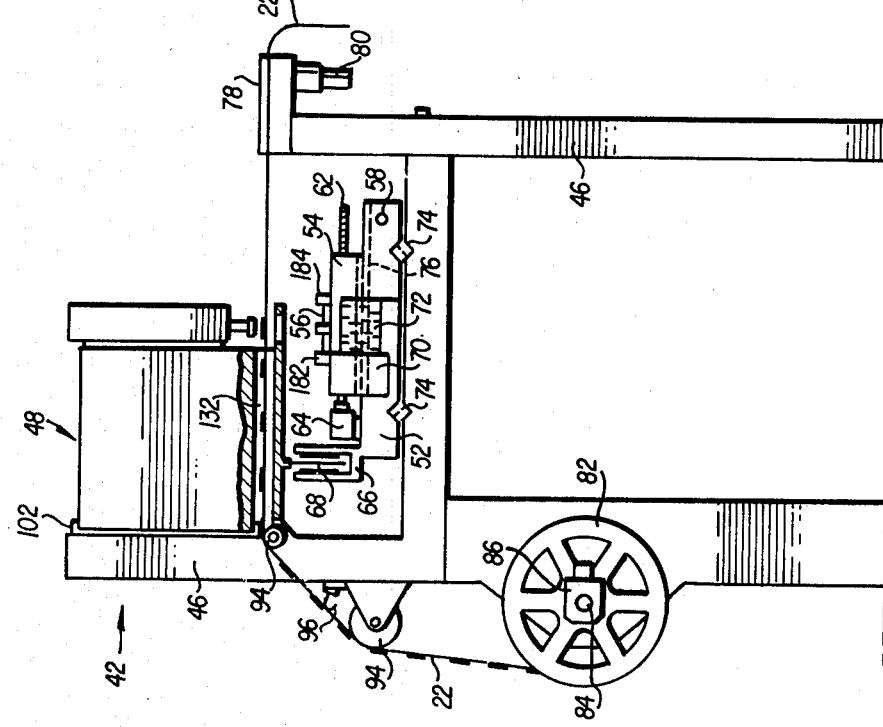
FIG. 5
FIG. 3

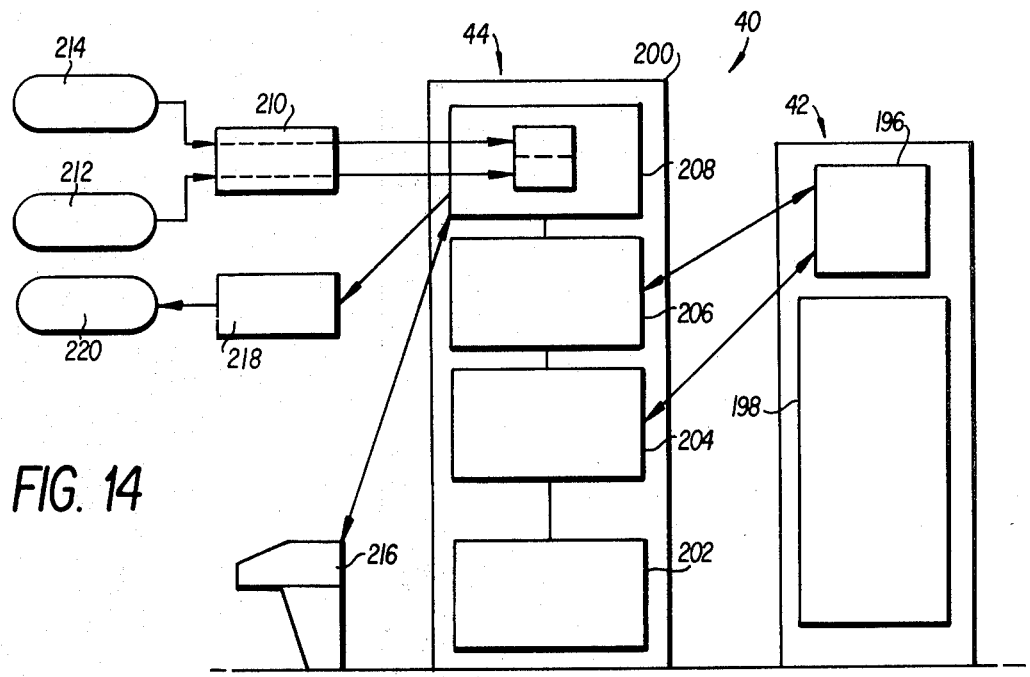
FIG. 14
FIG. 16
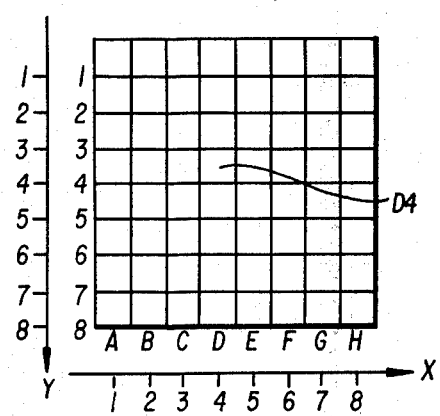
FIG. 18
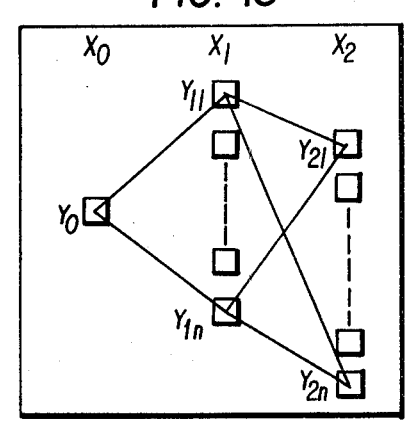
FIG. 15B
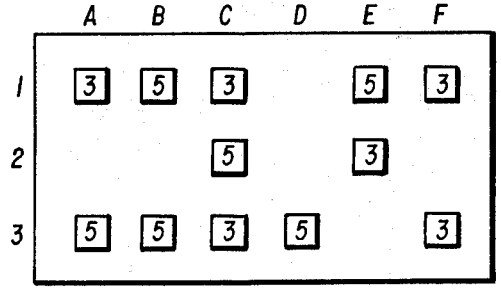
FIG. 15A

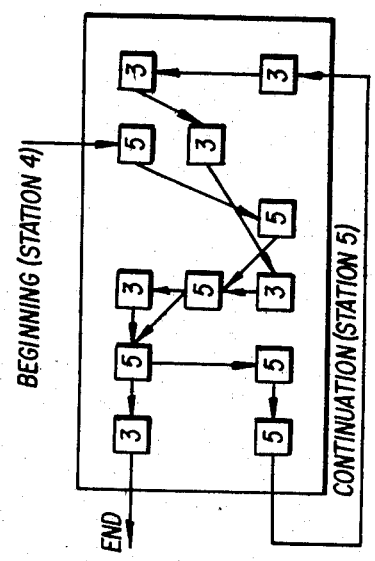
FIG. 15F
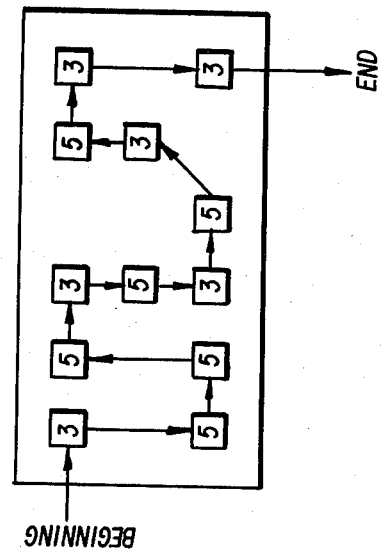
FIG. 15I
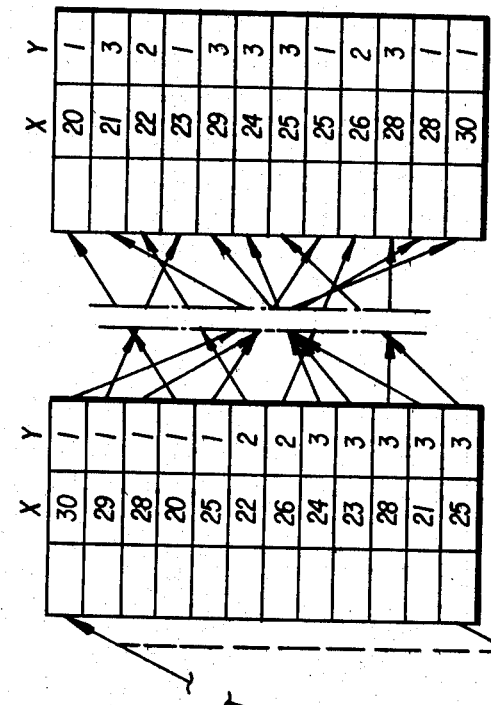
FIG. 15E
FIG. 15D
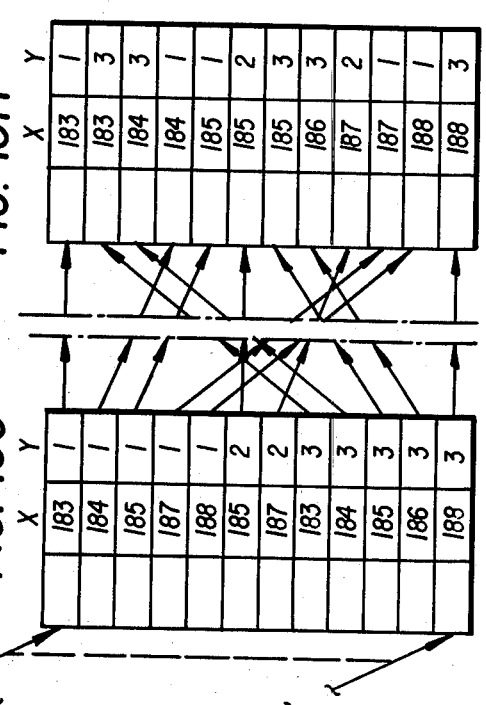
FIG. 15H
FIG. 15G
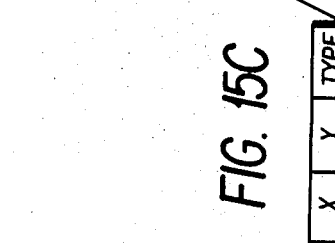
FIG. 15C

APPARATUS FOR MOUNTING DEVICES ON A SUBSTRATE

This is a division of application Ser. No. 874,652, filed Feb. 2, 1978.

BACKGROUND OF THE INVENTION

1. Field of the Invention

The present invention relates to a method and apparatus for mounting devices on a substrate, and in particular for mounting devices such as electronic integrated-circuit components.

2. Description of the Prior Art

In the modern techniques which are currently employed for producing electronic equipment and particularly data processing assemblies, increasingly frequent use is being made of integrated-circuit semiconductor devices, which are not enclosed. These unenclosed devices are normally referred to as integrated circuit chips. They are generally rectangular in shape and are provided on at least one of their sides with output conductors. Such devices ae distinguished on the basis of their operational type or the categories into which their dimensions fall (these dimensions generally being of the order of a few millimeters).

In order to make such devices easier to handle, it has been proposed to dispose a plurality of these devices at the center of rectangular openings spaced along a film support. A device is attached to the film by an array of conductors, each conductor having one of its ends soldered to a contact on the device and its other end attached to an edge of the opening. To remove one of the devices, it is merely necessary to cut through the conductors in the gap between the device and the support film.

Also known is the use of connecting substrates, which frequently take the form of a board generally made of an insulating material, which is provided with connecting conductors produced in the form of circuits printed on the board. These conductors generally extend from connecting areas disposed adjacent spaces reserved for one type of device and terminate either at similar connecting areas or at out connecting terminals intended to link the substrate to a piece of electronic equipment.

SUMMARY OF THE INVENTION

It is an object of this invention to provide a new and improved method and apparatus for removing devices, in particular electronic components, from their support film and mounting them on a connecting substrate.

In accordance with this and other objects of the invention, the new method of mounting devices on a connecting substrate comprises the steps of (1) placing a first reference system on the substrate with respect to which are defined a first set of positions of the devices as attached to the substrate; (2) selecting an appropriate device for each of these positions; (3) establishing selectively a second reference system independent of the first reference system, with respect to which are defined a second set of positions of the devices intended to be mounted on the substrate; (4) accurately positioning the substrate in relation to the second reference system; (5) shifting the substrate by altering the first reference system relative to the second system so as to align the first set of positions on the substrate with the second set of positions of the corresponding devices, and (6) attaching to the substrate each device which has been positioned on it.

As a result, the mounting apparatus according to this invention is of the kind of assembling and mounting devices intended to occupy predetermined positions on a connecting substrate which comprises a first plurality of predetermined positions, these devices being divided into a second plurality of types, and a third plurality of categories determined by their dimensions. The mounting apparatus includes a movable table having a plate to support the substrate, means for shifting the table and the plate, and cutting and attaching tools connected to control means. The control means operates to arrange the tools in at least one line, to assign the devices of each type to at least one of the cutting tools, to assign the attaching tools to at least respective ones of the categories, and to effect coupling of the positioning means on the one hand to the means for shifting the table and the plate, enabling one of the predetermined positions on the substrate to be correctly positioned under the appropriate tool, and on the other hand to enable the cutting tool to be actuated when the predetermined position is correctly placed under the tool.

BRIEF DESCRIPTION OF THE DRAWINGS

The features and advantages of the invention will become more apparent from the following description, which is given with reference to the accompanying drawings, in which:

FIG. 3 is a side view of the apparatus shown in FIG. 2;

FIG. 5 is a side, sectioned view of a cutting head according to the invention, taken along line V—V of FIG. 6;

FIG. 14 is a block diagram of the circuits for monitoring and controlling the apparatus shown in FIG. 2;

FIG. 15A shows another example of a connecting substrate to be equipped by means of an apparatus according to the invention;

FIG. 15B shows an external equipping plan for the substrate shown in the FIG. 15A;

FIG. 15C shows an internal equipping plan intended for the monitoring and control unit of the machine shown in FIG. 14;

FIG. 15D shows a non-optimised cutting sequence for the substrate shown in FIG. 15A;

FIG. 15E shows a cutting sequence which has been optimised by the monitoring and control unit;

FIG. 15F shows the cutting path resulting from implementing the optimised sequence shown in FIG. 15E;

FIG. 15G shows a non-optimised soldering sequence for the substrate shown in FIG. 15A;

FIG. 15H shows a soldering sequence which has been optimised by the monitoring and conrol unit;

FIG. 15I shows the soldering path resulting from implementing the optimised soldering sequence shown in FIG. 15H;

FIG. 16 illustrates, by way of example, a manner of relating the designations for the positions used in drawing up the equipment programs shown in FIGS. 15 and the relative x and y co-ordinates associated with the substrate;

FIG. 18 shows an example of the path which will be used to show how the optimum sequences are defined as this affects the Y axis movements of a substrate;

FIG. 29 shows the successive positions of the head to which FIGS. 19 to 28 relate.

DESCRIPTION OF THE PREFERRED EMBODIMENTS

Figure 1:
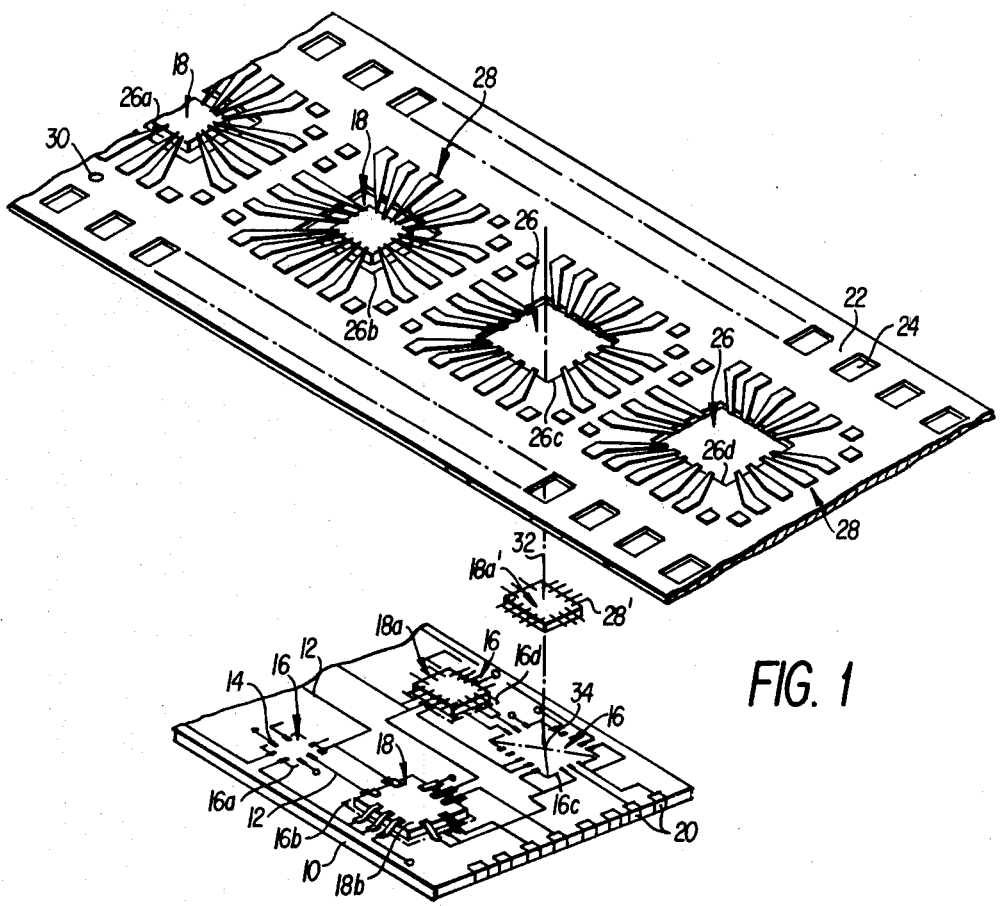
FIG. 1 is a perspective view of a film supporting a plurality of integrated-circuit semiconductor devices cooperating with a connecting substrate, the figure being intended to illustrate the object of the invention.

The object of the invention is cleary illustrated by FIG. 1 of the drawings. FIG. 1 shows a connecting substrate 10 having an array of internal conductors 12, which are connected to contact areas 14. A plurality contact areas 14 are disposed about each of the various spaces 16, which are each intended to receive a device or component. In the present case, this device or component is a semiconductor device 18 of a certain type, which is more generally referred to as a chip. Certain of the conductors 12 lead to terminals 20 for external connections which are intended to be connected into an item of electronic equipment, such as a data processing assembly for example.

The devices 18 may be classified in two ways. A first way is to consider them from the point of view of their operational type. As an example, devices 18a and 18'a may be of the first type, whilst chip 18b may be of a second type. A second way is to categorise the devices 18 by their dimensions. In the example illustrated, chips 18a and 18b belong to first and second categories respectively. It is however possible for devices of different types to belong to the same category.

Devices 18 of any one type which are intended for placing on the substrate 10, are transported thereto by a support member such as a film or strip 22, which is made from an intensible flexible material. Along each of its edges the support member 22 is provided with a series of equidistant perforations 24, which are symmetrical about the longitudinal axis of the film 22. In addition, the film 22 supports, in its central portion, a series of rectangular openings 26, around each of which is disposed an array of conductors 28. At the beginning, each opening is occupied by a device 18 of the same type (type 18a in the present case), as shown in openings 26a and 26b. The conductors 28 extend beyond the edges of the openings 26 within the film 22, in order to support the device 18 by respective ones of its ends. A special feature of the film 22 is that it incorporates marks associated with those devices 18 on the film 22, which have not met predetermined criteria in an operating test performed beforehand on all the devices 18 on the film 22. FIG. 1 shows one of these marks identified by the reference numeral 30. In the example illustrated, the mark 30 is a small hole made in the edge of the film, between the perforations at the corresponding edge of the conductors 28 associated with the device 18 in opening 26a. Any other type of mark may of course be used without affecting the principles of the invention. In other words, the device is in opening 26a has been judged unsatisfactory during a test performed beforehand on the film 22. The operation of the other devices 18 shown in FIG. 1 has been judged satisfactory.

FIG. 1 also illustrates the basic principle of the invention. Using a film 22, and with reference to opening 26c, the method of this invention comprises the steps of shifting the substrate 10 so as to align the center of 26c with the center 34 of a space (space 16c in the present case), along the axis 32 shown in dotted lines. Device 18'a is then separated from the film 22 by cutting the ends of the conductors 28 disposed between the device 18'a and the edges of opening 26c, the portions of the conductors attached to chip 18'a being referred to in the text as the device's external conductors 28'. Device 18'a is then disposed with in space 16c. As a result of this operation, device 18'a will be disposed in the same way as device 18a in FIG. 1, this latter device 18a being assumed to have come from opening 26d in the film 22. Following this step, an attaching tool, such as a soldering tool (not shown) will be pressed against the external conductors 28' to attach them to the appropriate contact areas 14 associated with space 16c. The final state is demonstrated in FIG. 1 by device 18b, which has its external conductors 28' soldered to the substrate 10.

In conclusion, the foregoing description shows that it is necessary to have a different film 22 for each type of device 18 required by the substrate 10. Consequently, as many cutting tools will be needed as there are types of devices 18 required for a substrate 10, to enable the devices to be cut from the corresponding films 22. Conversely, given that the soldering is performed by applying pressure and heating the external conductors 28' of a device 18, it is only the dimensions of the devices 18 which determine the number of soldering tools required. In other words, at least as many soldering tools are required as there are categories of devices 18, required to equip a substrate 10 with all its devices 18. In what follows, the respective centers 34 of the spaces 16 on a substrate 10 will be referred to as the "predetermined positions" on a connecting substrate 10.

Figure 2:
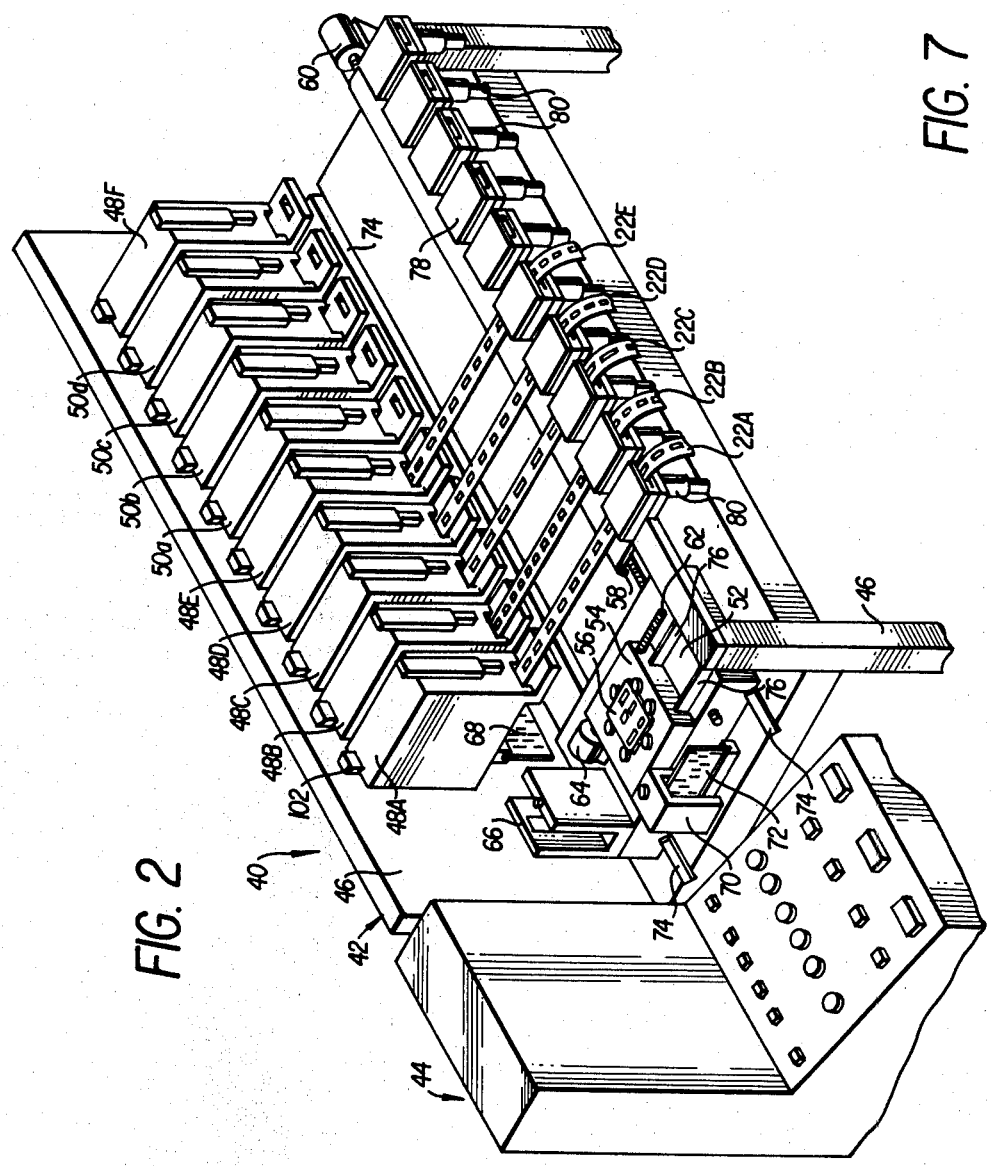
FIG. 2 is a perspective view of an embodiment of the apparatus according to the invention, comprising a soldering machine, and a monitoring and control unit.

FIGS. 2 and 3 give an overall view of an apparatus 40 according to the invention, which is intended to solder the external conductors 28' of the semiconductor devices 18 to a connecting substrate 10. The method of solder-mounting according to the invention will be described below on the basis of this apparatus 40. The apparatus 40 comprises a soldering machine 42 associated with a monitoring and control unit 44 which is designed to monitor and control the operation of the machine 42. In the present instance, unit 44 is a computer manufactured by the Honeywell Information Systems Inc. and designed H316. An outline description of this unit is given below with reference TO FIG. 14.

The machine 41 illustrated in FIGS. 2 and 3 has a chassis 46, on which are mounted cutting heads 48 and soldering heads 50 the number of which, in the illustrative embodiment being described, is equal to a maximum of ten, though other numbers could be selected. The description of FIG. 1 showed that the number of cutting heads and the number of soldering head were functions respectively of the number of types and the number of categories of the device 18 required to fully equip a substrate 10. In the example being described, it will be assumed that five types of devices 18 and four categories of devices 18 are required. Consequently, the machine 42 has to have five cutting heads 48A to 48E, and four soldering head 50a to 50d. The tenth head 48F is not required and is not involved in the normal operation of the machine 42. (For reasons which will be given below, it will be assumed that it is a cutting head 48F.

The chassis 46 also incorporates a movable table 52 which carries a movable plate 54 intended to hold a connecting substrate 56 such as the substrate 10 shown in FIG. 1. The table 52 moves on a threaded spindle 58 which is driven by a motor 60 controlled by unit 44. It is useful for the motor 60 to be a motor of low inertia such as a DC motor having a flat rotor. Plate 54 moves on a threaded spindle 62 which is driven by a motor 64 controlled by unit 44. It is useful for the motor 64 to be a low-inertia motor such as a DC bell motor (having an iron-free rotor).

Secured to the table 52 is a U-shaped member 66, whose two sides are parallel to the threaded spindle 58 and which is intended to co-operate with first slotted plates 68 connected to respective cutting and soldering heads 48 and 50, as will be described below. Similarly, plate 54 has secured to it a U-shaped member 70, whose sides are parallel to threaded spindle 62 and which is intended to co-operate with a second slotted plate 72, which is fixed to, but detachable from, table 52.

FIGS. 2 and 3 also show that the table 52 moves on two guides 74 disposed parallel to the threaded spindle 58 by means of a bearing system employing mutually inclined rollers, such systems being well known in the art by reason of the stability which they confer on a moving part. Similarly, plate 54 moves on two guides 76 by means of a similar bearing system. Since spindles 58 and 62 are disposed perpendicular to each other, movement of plate 54 due to driving of one spindle is in a direction perpendicular to the movement of plate 54 when the other spindle is driven.

The chassis 46 also includes means for unrolling the films 22 step-by-step, these means being formed in the present illustrative embodiment by ten step-by-step film unrolling devices 78 associated respectively with the heads 48 and 50 of the machine 42. The unrolling devices 78 are of conventional construction and are each driven by a system provided with a motor 80, such a system being described in U.S. Pat. No. 3,825,161 corresponding to 2,225,977 for example.

Figure 4:
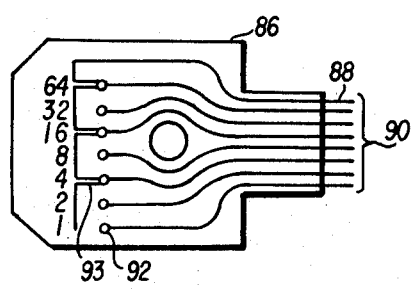
FIG. 4 shows an embodiment of a reel-identifying tag according to the invention.

FIG. 3 also illustrates the position of the film corresponding to each cutting head 48. In FIG. 3, the film 22, which is of the kind shown in FIG. 1, is unrolled from a reel 82. The chassis 46 includes ten shafts 84 each able to hold one reel 82. Associated with the reel 82 is a tag 86 which identifies the reel by means of any desired code and this tag is connected to unit 44. FIG. 4 shows an illustrative embodiment of the tag 86, comprising a common line 88 and seven lines 90 which end in terminals 92. The connection or not by a link 93 to the common line 88 represents a binary number. The presence of a link may designate binary "0" for example and the absence of a link binary "1". With the tag 86 shown in FIG. 4, 126 different types of semiconductor devices 18 can be identified by the unit 44 to which lines 88 and 90 are connected. With this code, it would also be possible for example to indicate the absences of a reel by the code 0000000 and by the code of 11111111. In other applications, the code could of course be selected as a function of the number of types of devices for the purpose of identifying them. Returning to FIG. 3, it can be seen that the film 22 from reel 82 runs on various rollers 94. The machine 42 also includes a detector 96, for detecting the end of the strip 22, which is electrically connected to unit 44.

FIG. 5 is a side, sectioned view of the structure of the cutting head 48. Similar heads have already been described in patent applications filed by the present Applicants in France, in particular that bearing the number 72 39747 corresponding to U.S. Pat. No. 3,887,783. The head 48 in FIG. 5 has a substantially rectangular housing 98, which is provided on one side with a groove 100 intended to be co-operatively engaged with a rib 102 (FIG. 2) on the chassis 46 of the machine 42 to enable the head 48 to be detachably mounted on the chassis 46. The side of the head 48 opposite from that bearing the groove 100 contains an opening 104 through which passes a support member 106, which is secured on one side to a slider 108 carrying a cutting tool 110 and on the other side to a leaf spring 112. The other end of the leaf spring 112 is attached to a transmission member 114, which cooperates with a threaded spindle 116 which is driven by gearing 118 coupled to a DC motor 120. The threaded spindle 116 is coupled to upper and lower stop members 122. The threaded spindle 116 passes through the transmission member 114 and the latter is prevented from turning to enable the rotary movement produced by the motor 120 to be converted into a translatory movement along the axis of the threaded spindle 116. On the side facing member 106, the transmission member 114 incorporates pressure detecting means which are formed in the present case by a linear potentiometric sensor which, in the example illustrated, has its fixed part secured to piece 114 and is connected to a source of voltage (not shown) and its moving part or contact 126 of the potentiometric sensor, attached to the support member 106. Member 106 also incorporates the moving contact 128 of a means of monitoring the travel of the tool, which is formed in the present case by a linear potentiometer 130 which is attached to the housing 98 of the head 48 and is connected to a source of voltage (not shown), the moving contacts 126 and 128 are individually connected to unit 44 by means which are not shown. Unit 44 is also electrically connected to the motor 120 in order to control it.

The bottom wall of the housing 98 of the head 48 contains a slot 132, intended for a film 22 to pass through as shown in FIG. 3. Under the tool 110, the bottom wall is extended to form a die 134 which will be described below in detail with reference to FIG. 7. A detector 136 is disposed adjacent the die 134 for checking the quality of the devices, which is intended to co-operate with the holes 30 (FIG. 1) which are formed in a film 22 to indicate that a semiconductor device is unsatisfactory. In the example illustrated the detector 136 is a micro-switch which is actuated by member 106 when the pressure of a gas is present to indicate the presence of a hole 30; the means of supplying pressure to this detector are now shown. The detector 136 is connected to unit 44 and to the step-by-step unrolling device 78 corresponding to head 48 to enable it to cause the unrolling device 78 to skip the unsatisfactory semiconductor device 18 and to bring a satisfactory semiconductor device 18 under the tool 110.

Figure 6:
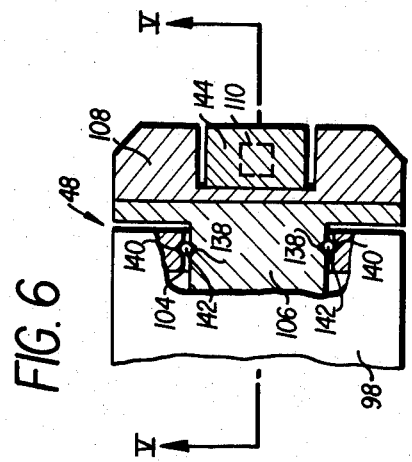
FIG. 6 is a sectional view taken along line V—V of the head shown in FIG. 5.

FIG. 6 is an enlarged scale, sectioned view taken along line VI—VI of FIG. 5. The FIG. 6 shows in detail the way in which the support member 106 is guided in the opening 104 in the housing 98 of the cutting head 48. Member 106 contains two opposing lateral grooves 138 which co-operate with respective ones of two other V-shaped grooves 140 in the sides of opening 104. Coupling is by ball-bearings 142 which use the V-grooves 138 and 140 as guides. The slider 108 shown in FIGS. 5 and 6 contains a tool supporting member 144 which is made of a mechanically rigid material.

Figure 7:
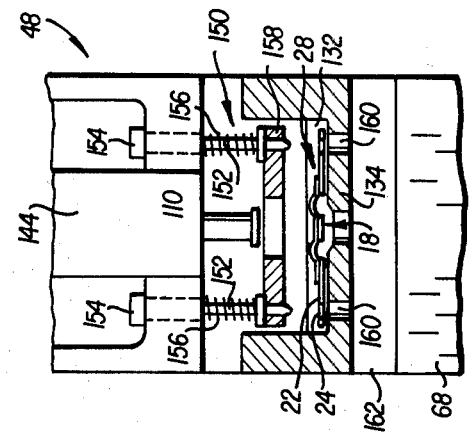
FIG. 7 is a front view looking along arrow VII of FIG. 5, and illustrates the systems associated with the cutting head.

FIGS. 5 and 7 show the structure associated with the tool 110. As shown in FIG. 5, the cutting tool 110 contains a central passage 146 which is connected to an external duct 148 which communicates with a suction source (not shown). The purpose of this is to retain the semiconductor device 18 which has been cut free during the travel of the tool towards the substrate 56. This feature is described in the aforementioned French application No. 72-39747 corresponding to U.S. Pat. No. 3,887,783.

A system 150 is associated with the cutting tool 110 for positioning the film 22 and holding it in position. The system 150 includes two shafts 152, which are provided with respective retaining heads 154 and respective coiled return springs 156, of which one end bears against the lower end of the slider 108. The two shafts 152 are fixed to a bar 158 against which the other ends of the springs 156 bear. The bar 158 is intended to press against the film 22, whilst the shafts 152 are intended to be thrust a little way into the perforations 24 in the film, in order to ensure that the position of the film 22 is steady whilst a device 18 is being cut free. The bar 158 and die 134 are of course provided with central holes to allow the tool 110 to pass through. The die 134 is also provided with orifices 160 which are intended to accept the ends of the shafts 152 and to locate them and the film 22 during the cutting operation.

Figure 12:
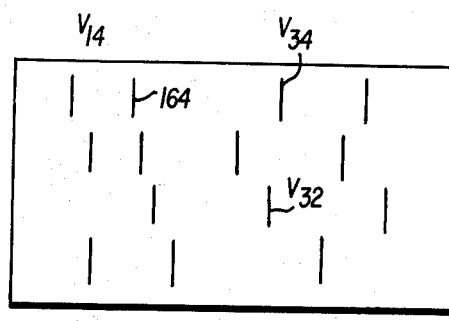
FIG. 12 shows a slotted abscissa plate resulting from the application of the method of definition illustrated by FIG. 11, this slotted plate being intended to co-operate with the U-shaped member shown in FIG. 8.

The soldering heads 50 may be of the same type as the head 48 shown in FIGS. 5 to 7, although in the case of the former, the tool 110 is a soldering tool. In the example being described, the soldering tool is one associated with an electrical heating element. The time for which current flows can be monitored in a known fashion by means of a thermocouple (not shown). It is also possible to add to the head a circuit for cooling the soldered joints by means of nitrogen (not shown). In addition, since the soldering head 50 does not co-operate with a film 22, it will incorporate neither the slot 132 nor a system 150 for positioning the film and holding it in position. Finally, the cutting and soldering heads 48 and 50 are both provided at the bottom with a rib 162 intended to act as an adjustable seating for a removable slotted plate 68 (FIGS. 1, 8 and 12).

Figure 8:
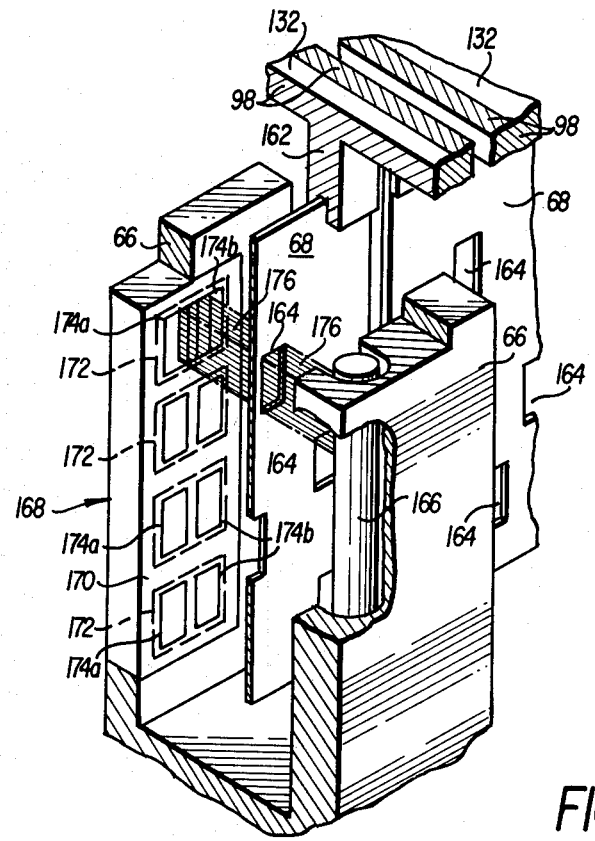
FIG. 8 is a partially cut-away perspective view of the U-shaped member, which is associated with the table for supporting the substrate and which is intended to cooperate with perforated plates carried by the cutting and soldering heads.

FIG. 8 illustrates the transmitter/receiver system which is associated with a U-shaped member 66 co-operating with the slotted plate 68. It will be assumed that the plates 68 contain four rows of oblong slots 164 (see FIG. 12), each having their major axis parallel to a given direction (the vertical direction in the drawings). The transmitter/receiver system comprises a transmitting device which, in the present example, is formed by an electric lamp 166 of elongated form which is orientated in the given direction (vertically in the drawings), and the length of which is sufficient for it to extend across all four rows of slots 164. This lamp 166 is mounted in one side of the U-shaped member 66 and is electrically connected to a source of electrical energy (not shown). The transmitter/receiver system also includes a receiver device 168 which takes the form of a panel 170 containing four photoelectric cells 172, which are in line with the given direction (the vertical direction in the drawings). Each of these cells 172 has two adjacent receiving areas 174a, 174b which are separated along a line parallel to the given direction. The panel 170 is mounted in the other side of the U-shaped member 66 in such a way that the light beam 176 which passes through a slot 164 (a slot in row R4 in FIG. 12) covers the entire length of the areas 174 in the given direction but only a portion of the width of these areas 174.

Figure 9:
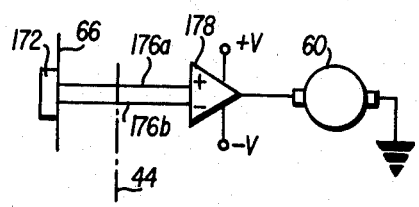
FIG. 9 is a schematic view of the electrical circuit associated with each photo-electric cell carried by the U-piece shown in FIG. 8.

FIG. 9 is a schematic illustration of the electrical circuit associated with each of the cells 172. The areas 174a, and 174b are connected, by connecting lines 176a and 176b respectively, to the positive and negative inputs of an operational amplifier 178 which is also connected to two voltage sources +V and −V. The output of the operation amplifier 178 is connected to an energising terminal of motor 60, whose second energising terminal is connected to earth. The lines 176a and 176b are also coupled to the control unit 44, which latter selects the row of slots which is to be looked at and counts the number of slots in this row which pass by, as will be described below.

The positioning of the U-shaped member 66 relative to a slot 164 takes place as follows. When the light beam 176 impinges in a random fashion on the two areas 174a and 174b, the areas generate electrical currents which are of different respective values. The difference between the currents results, via operational amplifier 178, in motor 60 being energized to drive the table 52 and the U-shaped member 66 in a direction which depends on the sign of the difference between the currents. In this way, the table 152 and the U-shaped member 66 will come to a halt when areas 174a and 174b are receiving equal luminous fluxes and emitting electrical signals of equal magnitude.

The plate 54 is positioned by means of a U-shaped 70, which has a transmitter/receiver system similar to that of U-shaped member 66. Its photoelectric cell similarly connected by operational amplifiers to the motor 64 driving the plate. Similarly, the U-shaped 70 will stop at a slot in the plate 72 determined by unit 44.

Figure 10:
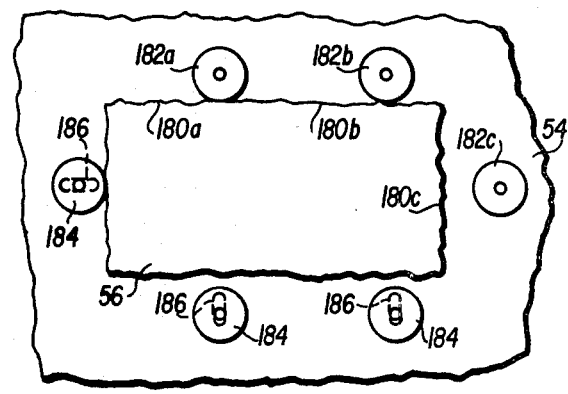
FIG. 10 is a schematic view of the means for setting up the substrate on the plate of the machine shown in FIGS. 2 and 3.

A description will now be given of the means for positioning the substrate 56 on the plate 54 of the machine 42. FIG. 10 illustrates these means. Before these means are described, it should be mentioned that the positioning of the substrate 56 takes place with reference to a system consisting of three selected points 180a, 180b and 180c at the periphery of the substrate 56. In order better to bring out one of the features of the invention, the irregularity of the edges of the substrate 56 is exaggerated in FIG. 10. The three points 180a to c are three points at these edges which have been defined in relation to a given reference system so that, when transposed into a similar reference system, the substrate occupies precisely the same position as that which was defined with reference to the original reference system. In the case of FIG. 10, this reference system is formed by three rollers 182a, 182b, and 182c which are free to pivot on fixed shafts. When substrate 56 is in place, the points 180a, b and c should correspond with points on the peripheries of rollers 182a, b, and c respectively. This is a convenient means of reproducing the position originally selected. To set up the substrate 56 in this way and hold it in position, three other rollers 184 are provided, these rollers 184 being free to rotate on respective shafts which are able to move in slots 186. By withdrawing the rollers 184, the substrate 56 can be inserted between rollers 182 and 184 and a mechanical system (not shown). When released, the shafts of rollers 186 move towards rollers 182, thus automatically positioning the substrate 56. FIG. 10 shows an intermediate stage of this positioning operation. From FIG. 10, it can be seen that the movement of the long edge of the substrate 56 in response to the pressure from rollers 184, will cause the rollers 182 to turn as dictated by the irregularities. It should be mentioned that if the rollers 182 were pegs incapable of rotation the edges would rub against them. Depending upon the irregularities countered, the frictional forces would be more or less pronounced and would hamper the movement of the substrate 56. In addition, there would be a danger of removing material from the irregularities, which might detract from the accuracy with which the substrate 56 needs to be positioned. The use of movable rollers solves all of these problems. Once the substrate 56 has been positioned on the plate 54, it is held in position by a suction system (not shown) which acts from below the substrate 56.

Figure 11:
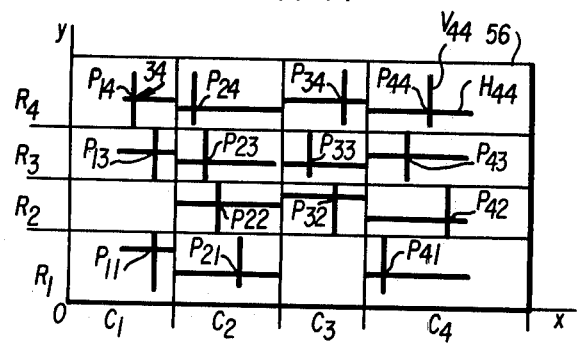
FIG. 11 shows a means of defining positions representing the centers of the spaces for the semi-conductor devices to be mounted upon the substrate.
Figure 13:
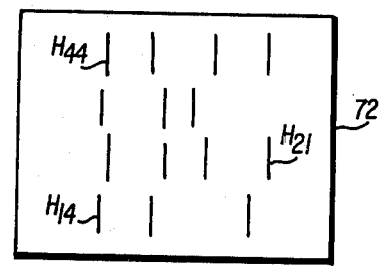
FIG. 13 shows a slotted ordinate plate resulting from the application of the method of definition illustrated in FIG. 11, this plate being intended to co-operate with the U-shaped member on the substrate-supporting plate.

Now that all the details of the structure of the machine 42 has been described, the operation of the machine will be described with reference to a particulate substrate, which is given solely by way of example. It will be recalled that reference numeral 34 was used for the centers of the spaces reserved for each device 18 on the substrate 10 shown in FIG. 1. In the case of the substrate 56 which is shown in FIG. 11, the center 34 of these areas are identified by reference relative co-ordinates) relating to a first reference system which is defined in the example being described, where the co-ordinates are cartesian, by two mutually perpendicular axes Ox and oy which represent two adjoining edges of the substrate 56. In this way the centers 34 may be defined by the points of intersection of pairs of lines parallel to these axes. For reasons which will become clearer at a later stage, the substrate 56 is divided into four rows (also referred to as "corridors") R1, R2, R3 and R4, and four columns C1, C2, C3 and C4, the centers 34, thus each occupying a single box defined by a column and a row. For convenience when discussing the positions 34, they will hereafter be referred to by the letter P followed by the figures for their columns and rows. In each box, the positions (centers 34) are defined by the points of intersection of two line-segments parallel to the axes. The horizontal segments are marked by the letter H followed by the same references as are used for the corresponding positions, and the vertical segments by the letter V plus the corresponding references. As an example, position P44 has corresponding segments H44 and V44. The slots in the plate 68 are formed by using the vertical segments V as a basis as shown in FIG. 12. The length of the slots is of course independent of the length of the segments V. Similarly, slots in plate 72 are formed by using the H segments, as illustrated in FIG. 13.

The types of devices 18 intended for the substrate 56 are then determined as a function of the respective positions P of the devices 18 to be mounted upon the substrate 56. It was assumed above that five types of devices were needed to equip the substrate 56, which called for five cutting heads 48A to 48E. It was also assumed that these five types represented four dimensional categories, requiring there to be four soldering heads 56a to 56d. The table below gives an example of correspondences between the positions P and the types and categories of the devices 18 to be positioned on the substrate 56. The cutting and soldering heads 48 and 50 are referred to by letters corresponding to the types and categories.

| Type | Category | Positions |
|------|----------|-----------|
| A | a | $P_{14}$ $P_{34}$ $P_{42}$ |
| B | b | $P_{11}$ $P_{13}$ $P_{24}$ $P_{44}$ |
| C | a | $P_{32}$ |
| D | c | $P_{21}$ $P_{22}$ $P_{33}$ $P_{43}$ |
| E | d | $P_{23}$ $P_{41}$ |

In this example it is assumed that types A and C are of the same category a.

To produce the machine 42, a second reference system (absolute co-ordinates x, y) is established which is independent of the first reference system and with reference to which are defined the positions of the devices 18 intended to be mounted on the substrate and the points where soldering is to take place. In the machine 42, the device positions correspond to the axes of the cutting tools of heads 48A to 48E and the soldering points correspond to the axes of the soldering tools of the heads 50a to 50d (FIG. 2).

In the present embodiment, the axes of the cutting tools are arranged in a first straight line, and the axes of the soldering tools in a second straight line which coincides with the first. As can be seen in the drawings, the cutting and soldering tools lie along a line parallel to the threaded spindle 58 for moving the table 52. In the present case, this also corresponds to a direction parallel to the axis Ox defined above by the substrate 56 (FIG. 11) when the substrate is mounted on the plate 54 in the way shown in FIG. 10. The slotted plates 68 are aligned in this direction.

It is now a simple matter to explain the operation of the machine 42. First of all, the substrate 56 is set up on the plate 54 in an extremely accurate fashion, as shown in FIG. 10. In the example illustrated, this means that the substrate 56 is disposed in such a way its x-axis is parallel to the common line of alignment the cutting and soldering tools. At the beginning, the table 52 and the plate 54 also occupy absolutely precise positions (Xo, Yo) relative to the line of alignment of the tools. This position is determined by unit 44 as indicated below.

With the table 52 and the plate 54 in the starting position (Xo, Yo), the units 44 bring the motors 60 and 64 into operation to position the substrate 56 correctly under the tool of head 48a. Assuming that the types and categories which appear in the table above correspond to respective ones of the heads shown in FIG. 2, unit 44 will operate the motor 60 and 64 in such a way as to line up the axis of the tool of head 48a with, for example, position P14, as shown in FIG. 11. The table 52 and the plate 54 then adjust themselves respectively to the slot V14 in the plate 68 associated with head 48A and to slot H14 in plate 72, in the fashion which was described above with reference to FIGS. 8 and 9. The slots are known to unit 44, which has been provided with details of the first reference system, the types and categories of semiconductor devices 18 to be used, the correspondence between the positions P and the types and categories, and the arrangement of the heads relative to one another. Assuming that the plate 68 for head 48A takes the form shown in FIG. 12, unit 44 selects the first slot in the complete row R4 formed by a line of plates 68. After bringing the substrate 65 to a halt with position P14 on an axis similar to axis 32 in FIG. 1, unit 44 actuates head 48A to cut the device 18 from the film 22A (for devices of type A). The operation of the head 48A will be described further on. When the device 18 has been disposed at position P14, unit 44 then selects position P34 (see the above table), for example, and operates motors 60 and 64 accordingly. Positions P34 (the third position in the present case) is selected by unit 44 by counting the slots in row R4 in plate 68, whilst the ordinate position remains the same. After all the operations involving head 48A have been performed, the table 52 and the plate 54 position themselves relative to the head 48B in conformity with the above table. This involves shifting the substrate 65 and the first reference system in relation to the line of alignment of the tool which defines the second reference system, in order to line up each position with the corresponding semiconductor device 18. Once the substrate 65 has received its last device 18 from head 48A, it then passes under the corresponding soldering heads 50. Head 50a for example, which is of the category a, will operate at positions P14, P34, P42 and P32.

The substrate 56 is sub-divided into rows and columns of the x and y axes, as shown in FIG. 11. If this subdivision were not made, plate 68 for example could contain a series of slots 164 occupying the entire width of the plate. As a result, the slots corresponding to line segments V34 and V32, for example, would be very close together, and this would upset the positioning of the substrate 56 and the servo-control of the motors. By virtue of the subdivision shown in FIG. 11 for example, the slots in each row are sufficiently far apart for the servo-control to be satisfactorily operated and to allow the substrate 65 to be properly positioned.

The operation of a head 48 will now be described with reference to FIGS. 5 to 7. When a desired position P on the substrate 65 is on the axis 32 of the tool 110, unit 44 operates the motor 120 to cause transmission piece 114 to descend together with, via leaf spring 112, the tool 110. The travel of the tool 110 is represented in FIG. 5 by an arrow 88 whose origin 190 is situated at the lower level of tool 110 when the latter is in its initial raised position. A mark 192 corresponds substantially to the plane of the array of the conductors 28 on the substrate 22 (FIGS. 1 and 7). Between 190 and 192, the tool 110 does not encounter any obstacles and the leaf spring 112 is thus under a normal stress of a magnitude which is indicated electrically by the moving contact 126 of potentiometer 124. At the same time, the movement of piece 114 is indicated electrically by the moving contact 128 of potentiometer 130. The positions 190 and 192 are shown close to potentiometer 130 in FIG. 5 by the corresponding positions of its moving contact. Consequently, over the predetermined interval 190 to 192, unit 44 monitors the stress on leaf spring 112 by means of potentiometers 124 and 130. When the tool reaches level 192, it comes into contact with the conductors 28 which are attached to a device 18, whilst a drop in pressure is brought about in passage 146. The force of impact of the tool against the conductors 28 is reflected via leaf spring 112 at moving contact 126 and is translated into an electrical value by potentiometer 124. Unit 44, which knows position 192 from potentiometer 130, is in a position to evaluate the magnitude of the force of impact. If for example such a force had been produced in the interval 190 to 192, the impact force would have been considered as a fault on the part of the machine and would have caused head 48 to be stopped. Similarly, unit 44 recognises the force of impact at level 192, and is advised of its magnitude by potentiometer 124. Means are provided in unit 44 to compare the magnitude of this force with a predetermined upper-limit value. Should the force of impact exceed the limit value, unit 44 would consider the force of impact to be a fault on the part of the apparatus and would stop head 48 from operating. Between level 192 and the level 194 representing the upper face of substrate 56, the tool descends with its device 18 held suspended from it by means of the reduced pressure in passage 146. The travel involved as detected by potentiometer 130 and the pressure is measured by means of potentiometer 124. In this case too the unit makes the same checks on pressure. When unit 44 knows from potentiometer 130 that the tool has reached the level 194 representing the upper face of the substrate 56, the reduced pressure in passage 146 ceases in order to drop the chip 18, whilst unit 44 returns the tool 110 to its original position 190. At level 194, it also checks the force with which the tool presses against the substrate.

The soldering heads 50 may be similar to the heads 48 with tool 110 and its passage 146 replaced by a soldering tool associated with leads for supplying power to the electrical soldering heating element. When this is the case, level 192 no longer has to be allowed for. The soldering operation may be performed by a thermocouple associated with the soldering tool 110, or as a function of the time for which the soldering current is applied.

The unit 44 will now be described. The above description has set out the functions by which it monitors and controls the operation of the machine 42. Unit 44 is also provided with a program for optimizing the performance of the machine 42, by selecting the way in which the operating sequences succeed one another and by reducing to a minimum the amount of time they take. In other words, unit 44 calculates the shortest path to assemble a given substrate in a minimum time. It does so on the basis of a plan for assembling the substrate 65, as illustrated by FIG. 11 and the above table, on the basis of the arrangements of the heads 48 and 50, and on the basis of monitoring data which the unit 44 at all times receives from machine 42 (the pressure exerted by the tools, whether the semiconductor devices 18 are satisfactory, whether the end of the film 22 has been reached, etc.). If, for example, in the course of an operation the detector 96 for detecting the end of the strip 22 should make such a detection, the process would continue while the operator was replacing the film 22, either on the appropriate head or on another head such as head 48F which had been kept in reserve.

FIG. 14 is a block diagram of the apparatus 40 as controlled by unit 44. FIG. 14 shows the principle components of the unit 44 operating in relation to machine 42. In block form, unit 44 considers unit 42 as being formed by a monitoring block 196 connected to the mechanical assembly 198 of machine 42, this assembly comprises in particular of the cutting and soldering heads 48 and 50, the means for shifting the substrate 65, the means for advancing the strips 22 and so on. As for unit 44, it was stated above that it was formed in essence by the computer H316. In FIG. 14, this computer is represented by a cabinet 200. This cabinet contains a power supply block 202 connected to a desk 204 which communicates with an interface block 206 which acts as an interface between unit 44 and machine 42. The interface block 206 communicates with a memory block 208 which, in the example illustrated, has a capacity of 8K words. The monitoring and control block 196 communicates with the desk 204 and the interface block 206, and vice versa. The memory block 208 receives from a tape reader 210 information relating to the equipment plans for the substrates, represented by block 212, and information relating to the monitoring by calculator 200 of the operation of machine 42, this information being represented by block 214. This monitoring is performed by means of a programme which will be termed the "monitor" in what follows. The memory block 208 is also in communication with a teleprinter 216. In addition, a tape perforator 218 receives from the memory block 208 information for safeguarding the monitor, this information being represented by block 220.

Before describing the manner in which the process is monitored by the computer 200, the operation of the machine from the operater's point of view will now be described. The operator first of all ensures that the machine 42 is loaded with reels 82. No specific station is alloted for a given type of device. The operator is under no obligation, before starting the process, to check that all the types of chip required are present, that the numbers available are adequate, that the devices available at a station are compatible with the type of cutting head at the station, or that all the soldering heads required are present. The operator then places the substrate, which is to be equipped, on plate 54. He feeds in the type of substrate using the teleprinter 216 and initiates the process. From this moment the operator will have no more to do except in case of accident. Any action taken by him will however still be monitored by the computer 200.

The computer 200 extracts from its memory 208 the plan for equipping the substrate to be equipped, checks whether all the types of the devices 18 required are present by means of tags 86, determines the shortest path which the table 52 will have to follow, and starts the process. The substrate is equipped as described above.

With the machine described above, it takes approximately ten minutes to mount the devices 18 upon substrate having sixty-four positions, during which time the operator normally does not participate in the operation of the machine. However, it is possible for the operator to interrupt the automatic process of equipping a substrate at any time during its course. This interruption is however monitored by the computer 200 so that the process can be resumed and finished in the normal way. As stated above, the process is monitored by the computer 200 by means of a program termed the monitor. The general organization of this program and details of how it is put into effect appear in the flow charts shown in FIGS. 19 to 29, which form part of the text of the specification.

Regarding the general organization of the monitor program, the equipment plans are fed into the monitor program, either "on line" from the teleprinter 216 in the case of occasional simple plans, or individually from punched tape for use in sequence, or collectively from punched tape via tape reader 210 so that the computer 200 can assemble a file of equipment plans. The section of the memory block 28 not used by the monitor program is set aside for such a file. Approximately fifty equipment plans for substrates having sixty-four positions may be stored there. Loading such a file takes only approximately thirty seconds and can be done independently of the loading of the monitor program. Under production conditions, it is obviously the third method of feeding in equipment plans which will be used as a rule.

The machine is capable of being operated in a first or main mode to mount or equip substrates with devices 18, or a second or service mode; the up-dating in the monitor program of a table containing the recognised types and categories of device and the associated types of cutting and soldering heads, which table is used when checking the feasibility of the equipment plan and when drawing up the equipment sequences; printing out the state of this table; printing out a list of equipment plans contained in the memory file; printing out the state of the machine 42, the kinds and categories of devices 18 and the kinds and categories of cutting heads 48 and the welding heads 50 present, and the state of the reels; and finally safeguarding the monitor program, this option enabling the monitor to be preserved in its current state in the form of a self-loading punched tape, in particular after the table of devices and heads has been up-dated or the parameters of the process have been altered.

With regard to the tasks performed by the monitor program, the list below presents a summary of the operations which are described in greater detail in the flowcharts shown in the accompanying drawings (FIGS. 19 to 29). Before starting the main mode of operation, the monitor program:

calls up the equipment plan (from the memory file or from outside).

checks the general state of the machine 42, checks whether the types of devices 18 required are present (which types need not be mounted in the machine 42 in any specific way), checks for compatibility between types of devices 18 and types of cutting head, checks that the requisite soldering tools are present (which tools need not be mounted in any specific way in relation to one another), indicates to the operator any corrective action to be taken and monitors this action, and determines a sequence for equipping the substrate which minimises the time taken to do so, given that equipment the plan may be given in any order and allowing for the siting of the tools.

Whilst the main mode of operator is carried out, the monitor program performs the following steps:

(1) In the cutting phase:

effects and monitors the XY movements of the table 52 which bring the position P to be equipped under the requisite cutting head 48, checks the state of the supply reel, warns the operator if the reel becomes empty, and if necessary re-optimises the cutting sequence in the event of a change of reel 82, simultaneously with the movement of the table 52, it causes the film 22 to be advanced until a satisfactory device 18 is reached.

checks the descent of the cutting tool 110, the suction on the device 18 which is cut free, the tool's arrival against the substrate with a monitored force, and then the ascent of the tool 110, and links up with the next cutting and positioning operation.

(2) It automatically links up the cutting phase with the soldering phase.

(3) In the soldering phase it:

effects and monitors the X, Y movements of the substrate which bring the device 18 to be soldered under the requisite soldering tool, controls the descent and drafts the tool in a position against the substrate with a monitored force, monitors the welding of the device 18 with reference either to temperature or time, with these parameters depending upon the type of soldering tool employed, monitors the cooling of the soldered joints and then the upward movement of the tool, links up with the next soldering operation.

(4) It keeps a permanent watch on the safety functions of the machine 42 (that suction is present, that there are no excessive strains on the tools, that the electrical soldering generator is in a satisfactory state) and intervenes in case of incident to warn the operator and inform him of the corrective action which needs to be taken, and then monitors this action.

At this end of the equipping process, it returns the substrate to the loading point, links up with the next job, and increments the film 22.

Reference will now be made to the flow-charts shown in FIGS. 19 to 28.

Figure 19:
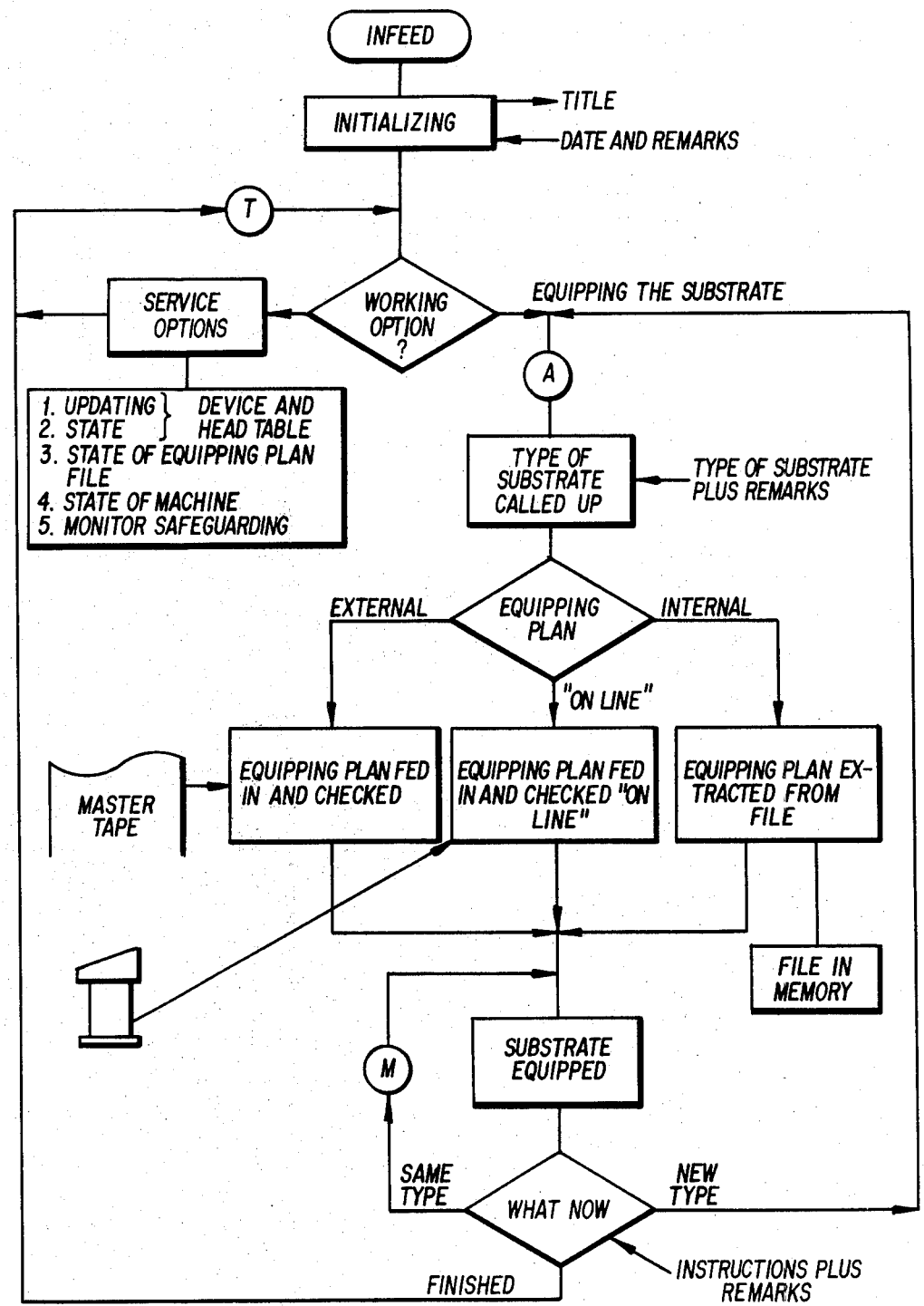
FIG. 19 is a general flow-chart for the operation of a machine according to the invention.
Figure 20:
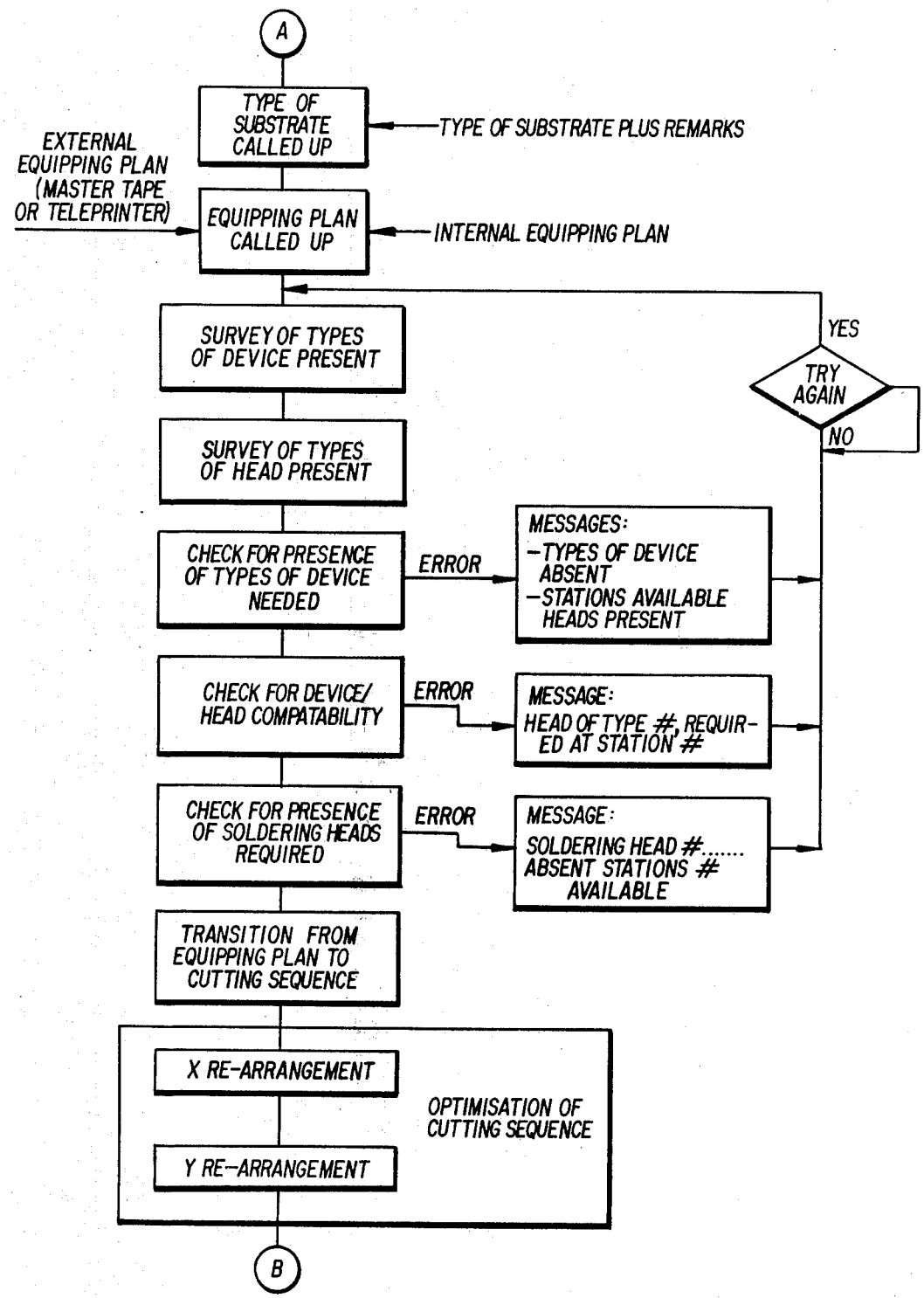
FIG. 20 is a flow chart related to the drawing up and optimisation of the cutting sequence of a machine according to the invention.

FIG. 19 illustrates the general flow-chart of the operations performed by the monitor program.

Firstly, the monitor program is initialised and the working option is asked. The service options are verified and, whether not, the operator is advised. "T" denotes the end step of the program. When the service options are all checked and satisfied, the step of equipping starts. "A" denotes the beginning of this step, which is described in greater detail in the following flow-charts shown in FIGS. 20 to 29. The type of substrate and the equipping plan are called up. The equipping plan can be internal, external or on-line. Then, the substrate is equipped according to the selected plan. "M" denotes the beginning of the step of equipping the substrate. When the equipment is ended, instructions are given by the operator: if a new substrate of a same type is to be equipped with a same plan, the program is set again to M; if a substrate having a new type is given, the program returns to A since this type has to be specified together with the corresponding equipment plan; and if no substrate is provided, the program is regarded as finished and returns to T.

FIG. 20 to 28 are connected to one another by the characters A–M and T and specify the step of equipping the substrate.

At A the type of substrate and then the equipping plan are called up. A survey of types of device and head present is made. The program then successively checks for the presence of types of device needed, for the device/head compatibility and for the presence of soldering heads required. Any corrective action is indicated to the operator and the program is called to make new survey and checks. If these operations are satisfied, the step concerning the equipping plan is ended and the program starts the cutting sequence.

Figure 21:
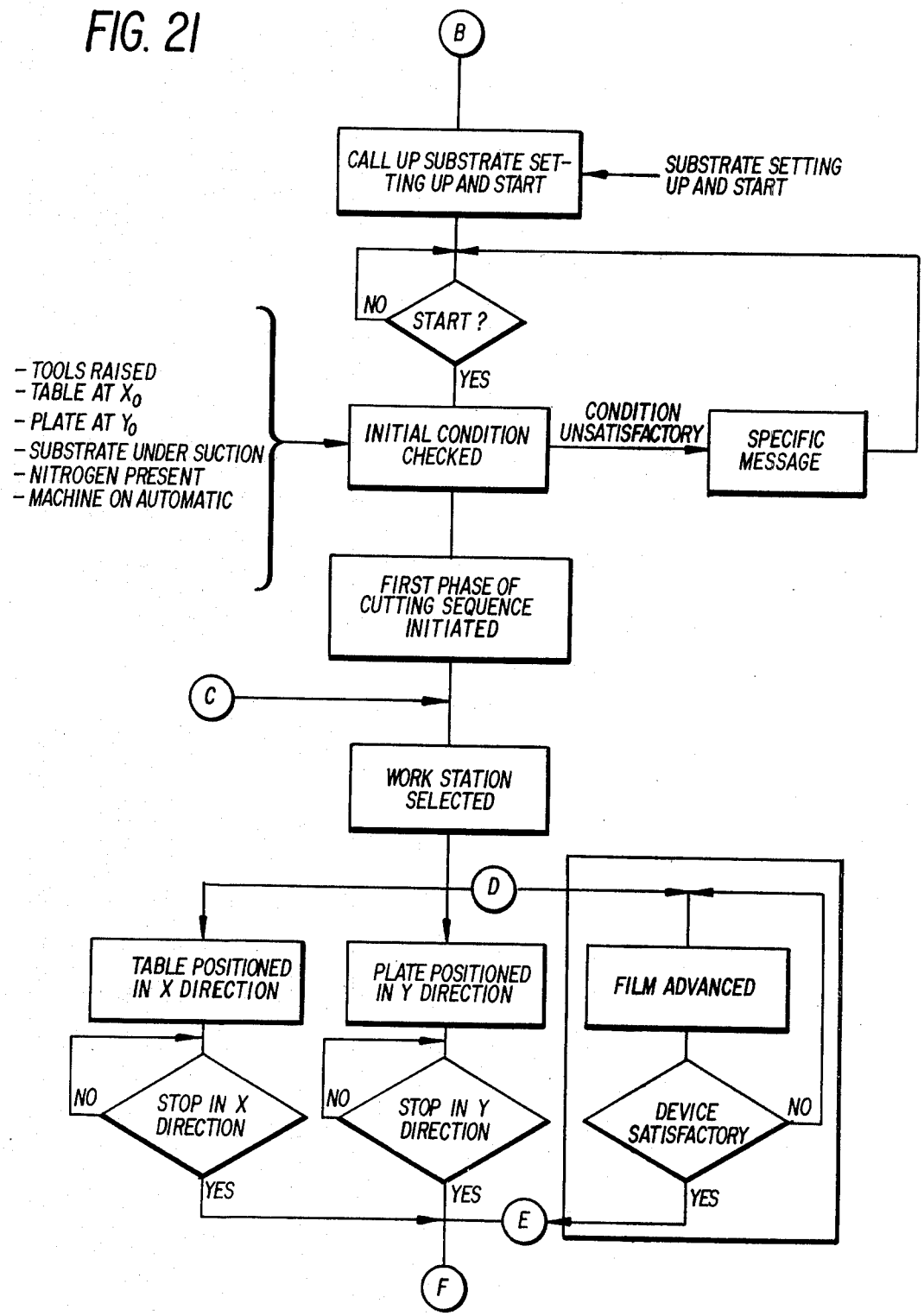
FIG. 21 is a flow chart representing the beginning of the cutting sequence and of the positioning of the tabel, the plate and the films.

Firstly, the cutting sequence is optimized, for example in the manner which will be described herebelow. Then (see FIG. 21) the substrate setting up and start are called up. Upon the end of these operations made by the operator, the program controls the start. If the start is assurized, the initial conditions are checked (for example: tools raised, table at $X_O$ and $Y_O$, substrate under suction, nitrogen present, machine on automatic, as indicated in FIG. 21). An unsatisfactory condition is indicated to the operator and the program is caused to check again the initial conditions after correction made by the operator. If the initial conditions are satisfactory, the first phase of the cutting sequence is initiated.

Figure 22:
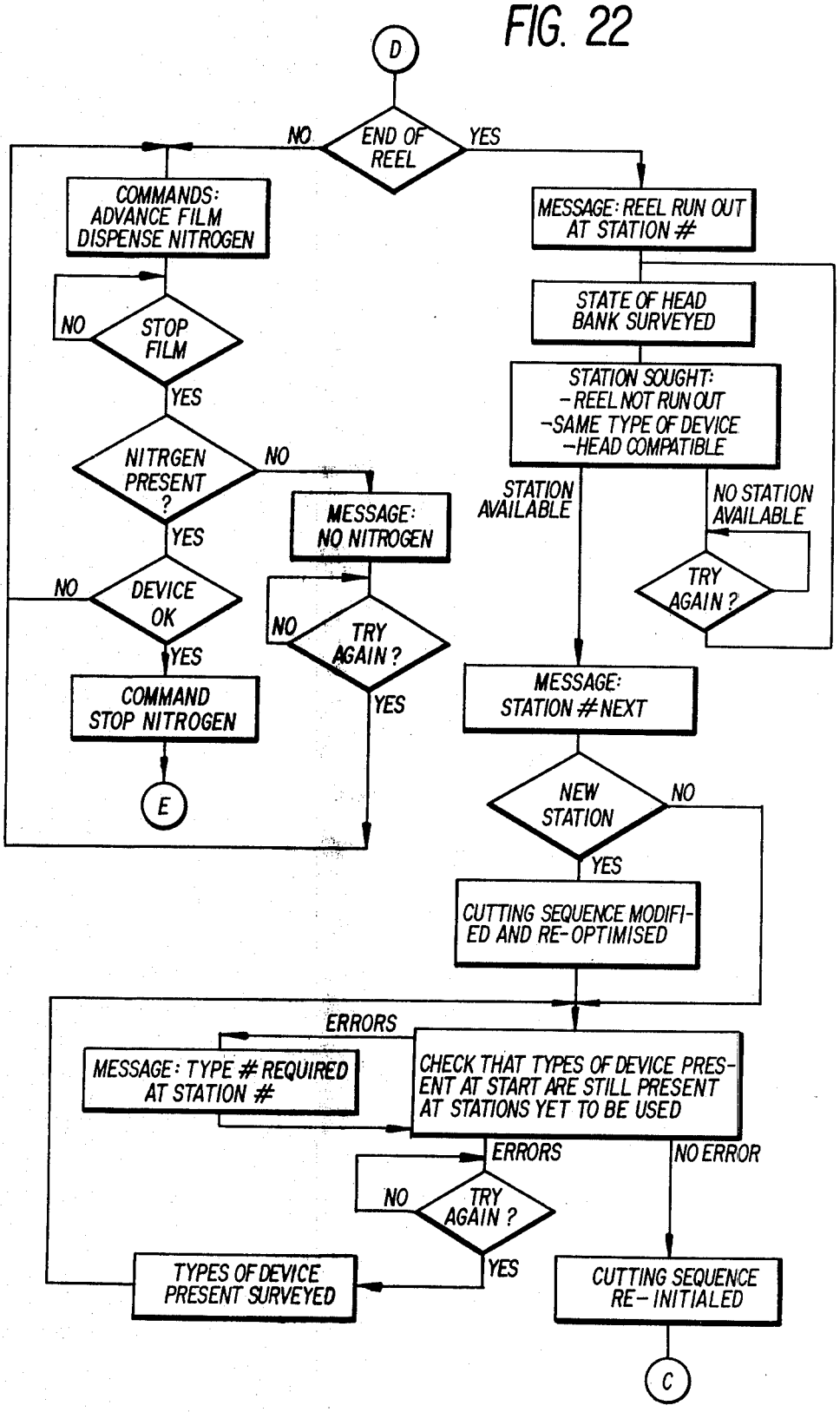
FIG. 22 is a flow-chart relating to the advance of the strip and the check that the semiconductors devices are satisfactory.
Figure 24:
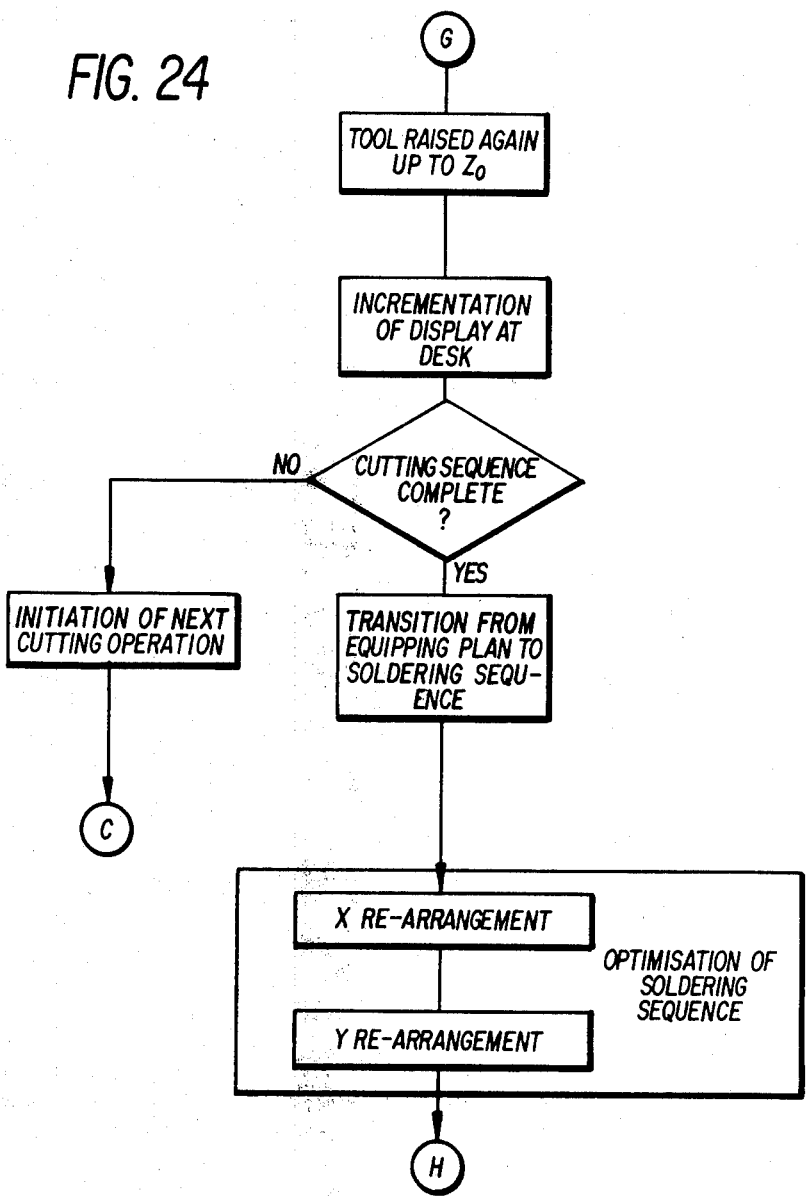
FIG. 24 is a flow-chart relating to the linking-up and formulation of the soldering sequence.

A selection of the working station is made after the initiation of the cutting sequence or after a re-initiation (C) subsequently performed, as shown in FIGS. 22 and 24.

Figure 23:
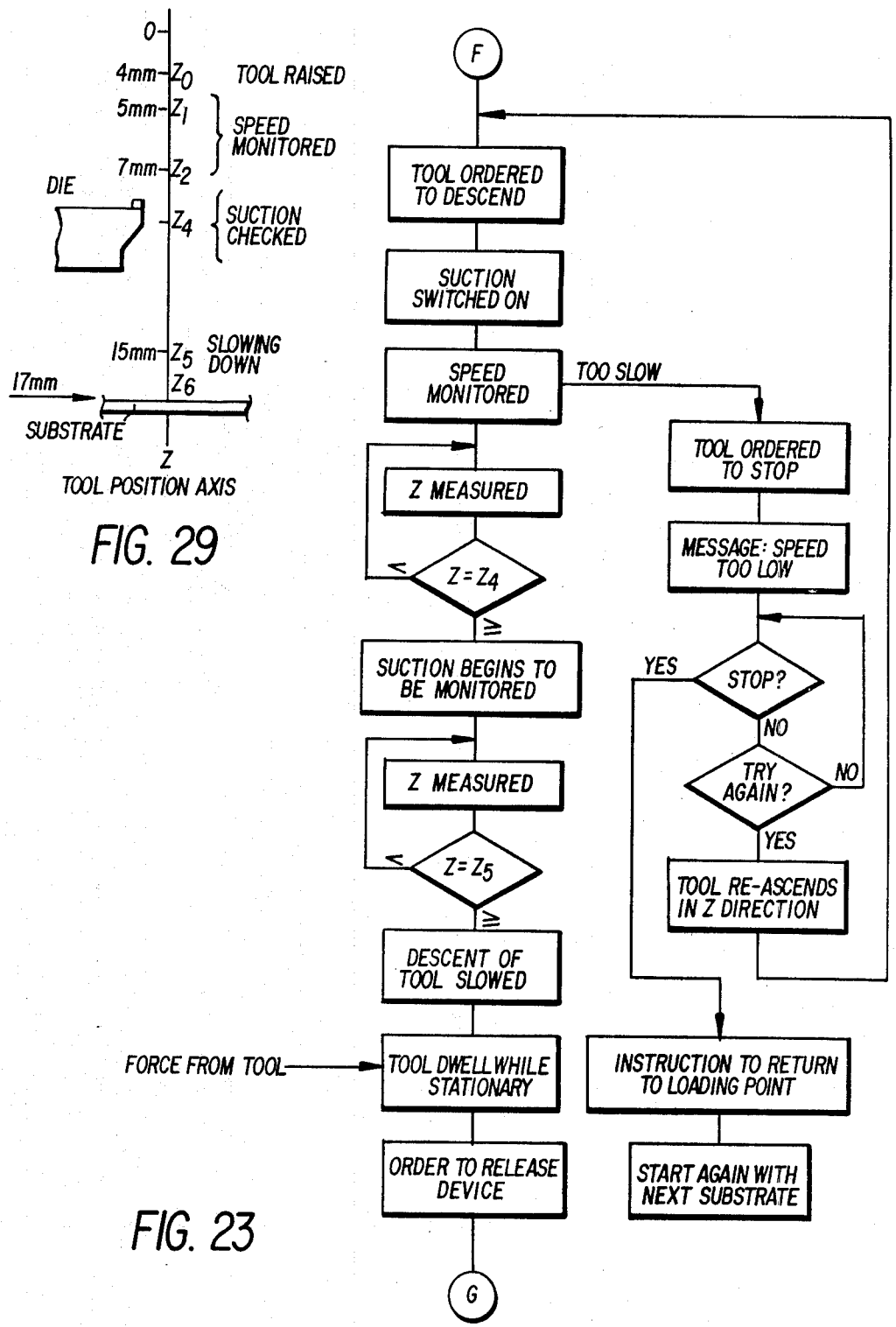
FIG. 23 is a flow-chart relating to the descent of a cutting head.

Upon selection of the working station, the table 52 and the plate 54 are respectively positioned in X and Y directions and the film is advanced. The program then arrives at F and continues as shown in FIG. 23. However, before continuing, details should be given on how the film is advanced. This step begins at D and ends at E or C as shown in FIG. 22.

With reference to FIG. 22, at D the program questions whether the end of reel 82 is reached. If not, the program commands the advance of film 22 and dispense of nitrogen. It stops the film accordingly and verifies whether nitrogen is present and the device 18 has a good operation. An absence of nitrogen is indicated to the operator and after the supply thereof the program re-commands the dispense of nitrogen. If a device 18 is found unsatisfactory, the program recommends the advance of film 22 and dispense of nitrogen. However, if the device is satisfactory, the monitor program commands the stop of nitrogen. The program now arrives at E.

If the end of reel 82 is reached, a message is transmitted to the operator for indicating where a reel is run out.

As previously mentioned, the monitor surveys the state of all the heads of the bank 46 for finding a reel 82 not run out and having a same type of device 18, and a head compatible. If a station is available, a message is transmitted to the operator for indicating that the step follows through the station available referred accordingly. If the available station is a new station, the cutting sequence is modified and has to be re-optimized. However, if the available station is not a new station, the cutting sequence is maintained.

The cutting sequence continues by checking that types of device present at start or still present at stations yet to be used. If no error is found, the cutting sequence is re-initiated and continues at C on FIG. 21. If errors are found, a message is accordingly transmitted to the operator and the program surveys the types of device present. The cutting sequence runs thus in a loop until no error is found.

The cutting sequence continues at F on FIG. 23. At this point, the tool can be ordered to descend. This is made while a suction is switched on for maintaining the device against the tool along the descent path. The tool speed is monitored before landing on the substrate. If the speed is too slow, the tool is ordered to stop and a message is sent to the operator for indicating to him that the speed is too low. If a stop is ordered, instructions are given to return to the loading point and to start again with the next substrate. Otherwise, the program is continued in causing the tool to be reascended in Z direction to the initial point Z0, and is returned to F.

If the tool speed is satisfactory, the distance Z is measured between Z0 and Z4 (see FIG. 29). Upon passing through Z4, the suction begins to be monitored. The distance Z is always measured and at Z5, the descent of the tool is slowed for beginning the landing. According to the force from the tool, the latter is stopped while an order is given to release the device 18. Accordingly, the device 18 dwells on the corresponding area 16 of the substrate 10. At this point, the program is at G.

Referring now to FIG. 24, it can be seen that after G the tool is raised again up to Z0. After that, an incrementation of display at desk is made and the program questions whether the cutting sequence is completed. If no, the next cutting operation is initiated and the program returns to C on FIG. 21. If yes, the program begins the soldering sequence.

The soldering sequence is firstly optimized, in a same manner as the cutting sequence and as lately described. At this point, the program is at H and continues as indicated on FIG. 25.

The first phase of the soldering sequence is initiated and the soldering station is selected. The selection can also be produced after initiation of a next phase of soldering sequence from I shown in FIG. 28. When the selection is made, the table 52 and plate 54 are respectively positioned in X and Y directions for matching the selected station with a corresponding area 16 of substrate 10. The tool is then ordered to descend and the distance Z is measured. Upon passing through Z5 (FIG. 29) the descent of the soldering tool is slowed before landing on the substrate. The force from the tool conditions the stop thereof. The program is now at J and continues as indicated on FIG. 26.

The mode of monitoring the soldering operation is selected. The selection depends on the type of tool. If the tool has no thermocouple, the soldering operation is time monitored, whereas if the tool has a thermocouple, it is temperature monitored. Note that the question about the selection is also raised after re-occurence of a soldering generator incident and repair. For a time monitor, the duration of soldering is selected and the soldering is commanded to begin. The duration is monitored until command for soldering to end. It is also generated a command for nitrogen to be dispensed. The cooling time is selected in accordance with the type of tool and the time is monitored accordingly, the end of cooling is translated by the character K.

Figure 27:
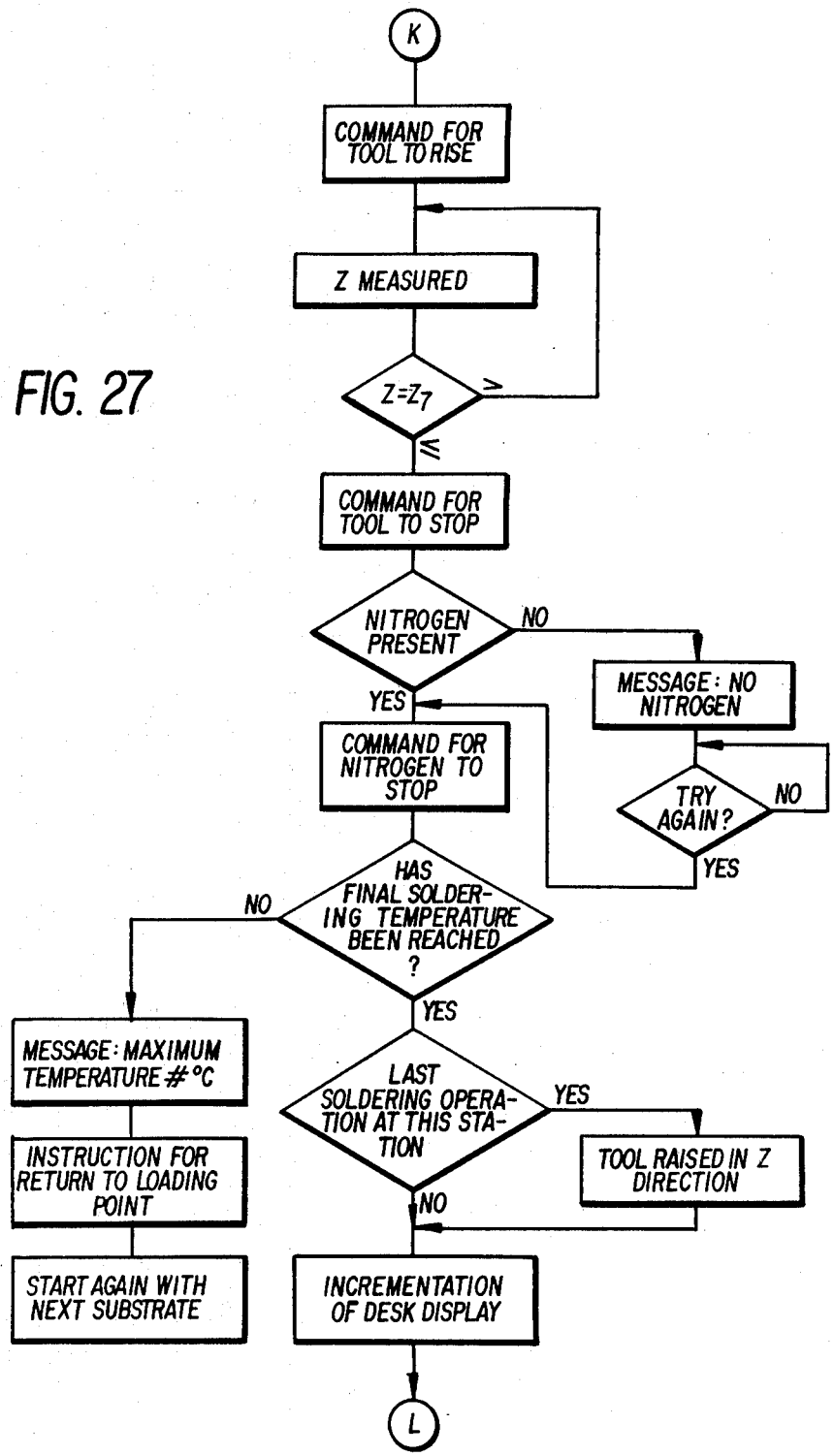
FIG. 27 is a flow-chart relating to the ascent of a soldering head.

If the soldering operation is monitored in temperature, the temperature at which soldering is to stop ($T_{SS}$) is selected. Command for soldering to begin is generated while the temperature is measured. When $T = T_{SS}$, the soldering is stopped and nitrogen is caused to be dispensed. The temperature continues to be measured until T is equal to the temperature $T_d$ at which the tool is free to withdraw. Thus, the program arrives at K, and continues as indicated in FIG. 27.

At K, a command for the tool to raise is generated and the distance Z is measured until Z=Z7 (between Z0 and Z6. A command for the tool to stop is then generated while the program questions whether nitrogen is still present. If no, a corresponding message is sent to the operator. Upon repair or if nitrogen is still present, a command for nitrogen to stop is generated. After that, the program raises the question: has the final soldering temperature been reached ? If no, a message is sent to the operator and instructions are given for returning to the loading point with a view to start again with the next substrate. If yes, the program asks whether the soldering operation at this station is the last one. The tool is raised up to Z0 in the affirmative. In the negative, or when the tool is at Z0, the desk display is incremented. The program is now at L and continues as shown in FIG. 28.

Figure 25:
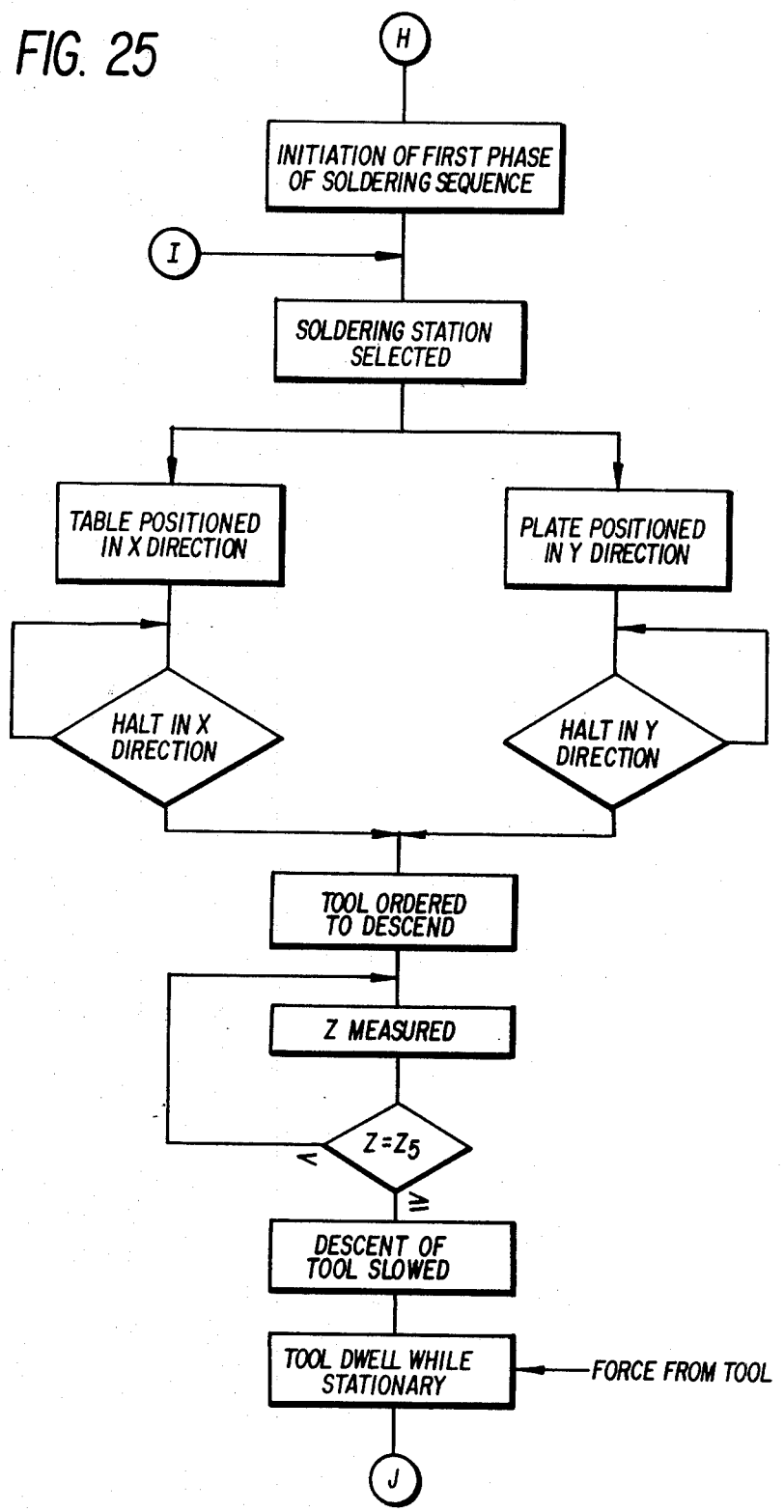
FIG. 25 is a flow-chart relating to the positioning of the table and the plate and the descent of the soldering head.
Figure 26:
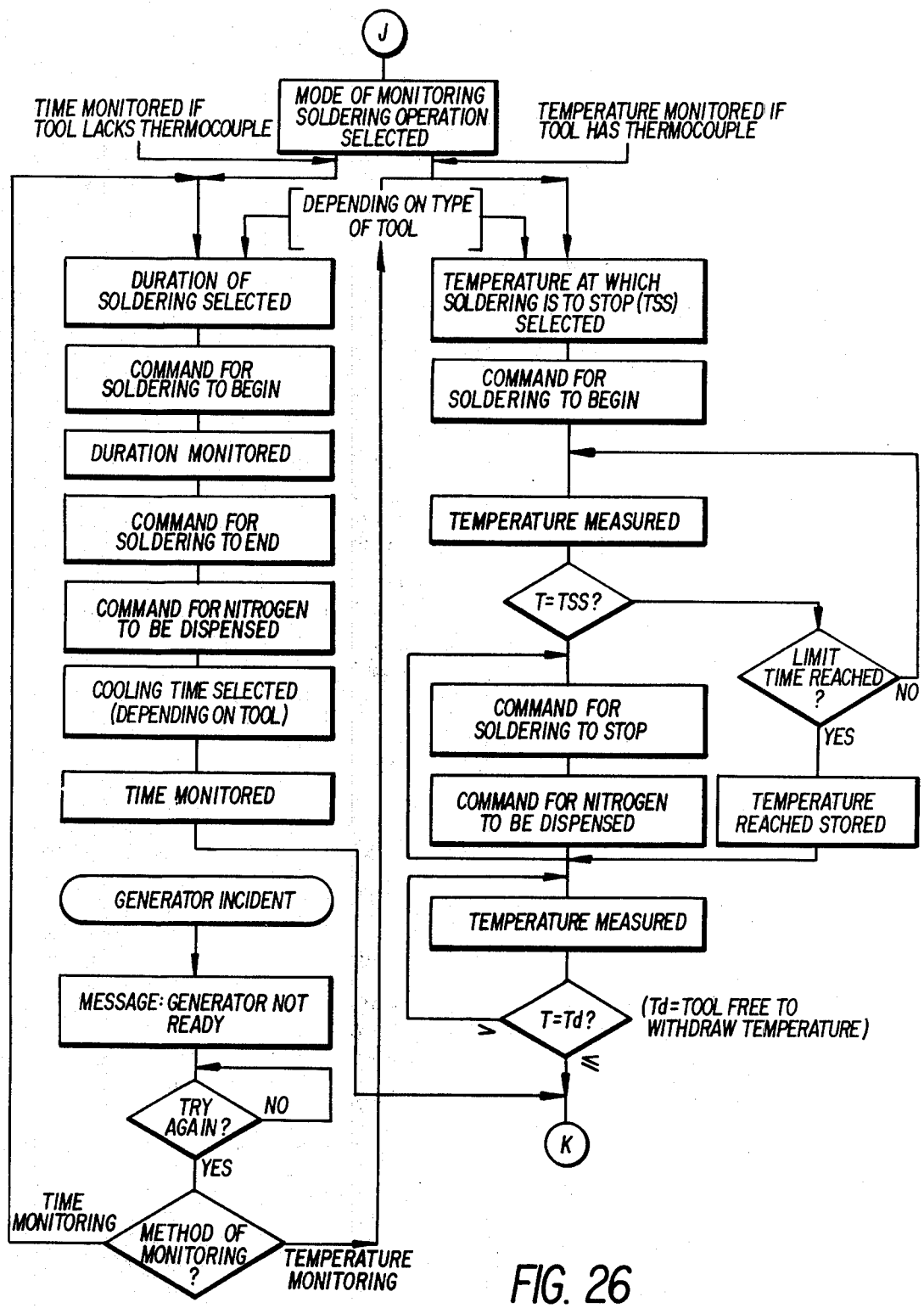
FIG. 26 is a flow-chart relating to the soldering and the cooling of the soldered joints.
Figure 28:
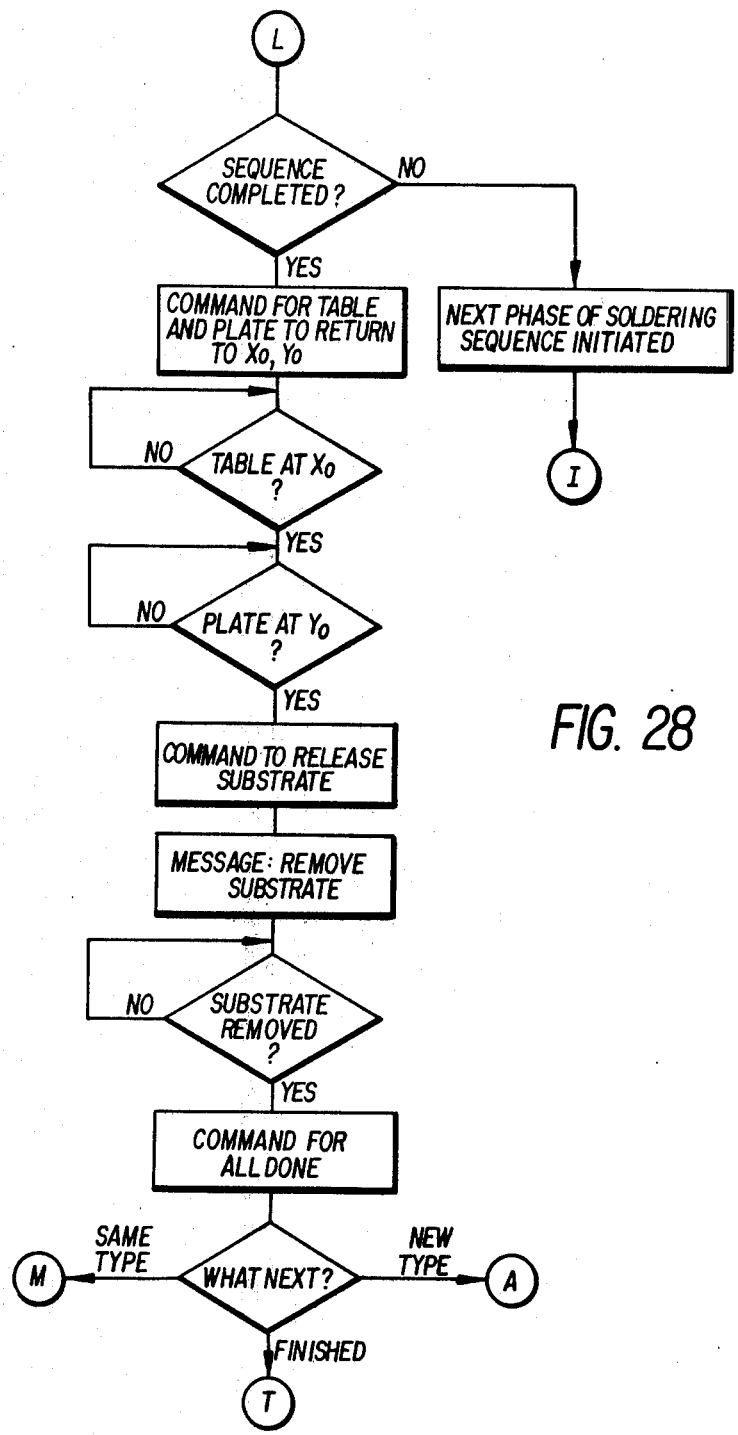
FIG. 28 is a flow-chart relating to the conclusion of operation of the machine.

With reference to FIG. 28, if the sequence is not completed, the next phase of soldering sequence is initiated and the program returns to I indicated in FIG. 25. If the sequence is completed, a command is generated for table 52 and plate 54 to return to $X_o$ and $Y_0$, respectively. When the table and the plate are at $X_0$ and $Y_o$, the substrate is released and a message, which mentions that the substrate can be removed, is shown to the operator. When the substrate is removed, a command is generated for "all done". Then the program asks "what next?". As illustrated in FIG. 19, if the next substrate is of a new type, the program returns to A; if the next substrate is of a same type, the program returns to M. and if no substrate is provided, the program is regarded as finished and returns to T.

Details will now be given on how the sequences are dranw up and optimized.

All the states through which the data passes whilst operations are going on are shown in FIG. 15, using a simple example which is different from that already given above so that the invention can be more completely illustrated.

Let it be assumed that the substrate is to be equipped with devices of given types 3 and 5 at the points indicated in FIG. 15A. It will be assumed that these devices are available at two stations 4 and 5 which are represented in FIG. 2 by the positions of the cutting heads 48D and 48E. It will also be assumed that the two kinds 3 and 5 of devices 18 belong to the same category and are operated on by a soldering head of type 1 which is located at a station 1 occupied in FIG. 2 by head 48A.

The equipment plan, in its external format, (FIG. 15B) gives for each position to be equipped the type of device 18 which is to be installed there. This list may be in any order whatever. In the monitor program, it will be in the internal format shown in FIG. 15C. Each position to be equipped with a device 18 has associated with it one memory word in the computer 200 which consists of the X, Y co-ordinates of the position on the substrate and a code for the type of device. The relationship between the designations for the positions used in drawing up the equipment plans and the relative X, Y co-ordinates is shown in FIG. 16. The transition from the equipment plan to the cutting and soldering sequences consists in replacing the data (x, y, type of device) given by the equipment plan by the absolute co-ordinates X, Y for the position which the plate 54 needs to occupy if the x, y position to be equipped is to be situated under the head of a tool containing the requisite type of device 18 (during the cutting sequence) and under a compatible soldering head (during the soldering sequence).

Figure 17:
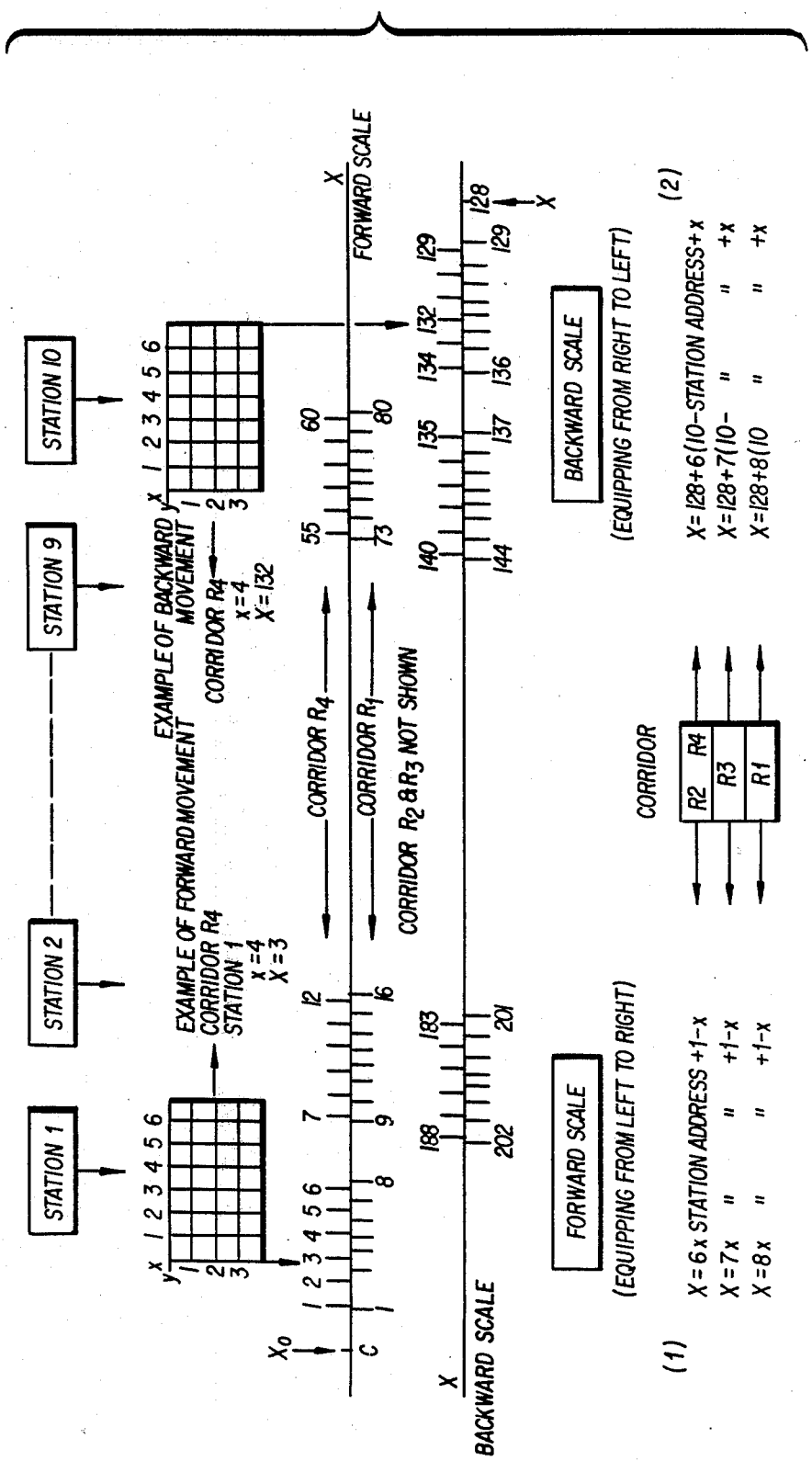
FIG. 17 illustrates relationships which enable a changeover to be made from the relative x axis of the first reference system to the absolute X axis of the second reference system for the substrate-supporting table.

Consideration will now be given to the system of absolute X, Y co-ordinates for plate 54. The monitor knows the position of the plate 54 by means of a system of absolute co-ordinates or scales X, Y. The X scale will first be considered. The various aspects of the X scale are shown in FIG. 17. When the table 52 is moving forward, a scale is used in which the successive positions in which the table is to stop, are numbered 1, 2, etc. from the loading point $Xo=0$.

It has been seen that each row or corridor on a slotted plate has its own scale, with points in the same serial position not necessarily occupying the same physical position. In the case which is now being considered the maximum value of X on the "forward" scale is $8 \times 10 = 80$.

When a table is moving backwards, the scale used is one in which the successive positions in which the table stops are measured from an imaginary point on the extreme right of the machine 42, as seen in FIG. 2, ($Xn=128$) and they are numbered 129, 130 etc. Each row obviously has its own scale for backward movement. From the monitor's point of view, the forward and backward scales form a single scale with intersecting abscissas. This expedient makes it possible to use the same algorithm for optimising the equipment sequences whether the table moves forwards or backwards. The correlations which make it possible to change from the relative x axis position to the absolute X position of the table are illustrated in FIG. 17. As regards the absolute Y scale, the relative y axis position and the absolute Y position of the table correspond ($Y=y$).

There will now be described the transition from the equipment plan to the un-optimised cutting sequence. In all cases, the cutting sequence is always drawn up and initiated by pre-planning for the table 52 a succession of movements in the forward direction. In the case of the example selected, a transition will be made from the equipment plan (FIG. 15C), to the un-optimised cutting sequence (15D), using the equations (1) from FIG. 17, with:
  the station 4 address for devices of type 5.
  the station 5 address for devices of type 3. It will be noted that in both tables in FIGS. 14, the various positions to be equipped appear in the same order. Before being carried out, the cutting sequence is optimised. The optimising procedure comprises of minimizing the distance travelled by the table and plate assembly both in the abscissas direction and in the ordinate direction. Since the two movements are independent and simultaneous, the X path and the Y path are minimized independently of one another.

Consideration will first be given to the X optimisation. In the case of X, the practical situation which exists is one which simplifies the operation; the distance between two successive heads (55 millimeters in the examples selected) is greater than the size of the largest substrate accepted by the machine (approximately 50 millimeters). As a result, if the table 52 is shifted with a movement in a constant direction from one end of the machine to the other, the substrate which it carries is completely clear of one head before arriving under the next head. Consequently, to minimise the X path, it is merely necessary to control the table 52 in such a way that it travels from the loading point Xo to the requisite point furthest to the right in a succession of advances (with halts at the required points), and then to cause it to return to Xo in a succession of backward steps (with halts at the requisite points).

This result is achieved by arranging the various items in table 15D in order of ascending value. The result of this arrangement is an optimised cutting sequence in the X direction. It will be noted that, as a result of this re-arrangement, all the Y plots which share the same X plot are likewise in ascending order.

The Y optimisation will be understood by referring to FIG. 18, which shows the following general case. With a certain X measurement Xo, the last position YO to be equipped has been equipped. The next positions are situated at X measurements X1, and then X2. The measurements XO, X1, and X2 not necessarily contiguous. Between the extreme positions Y11 and Y1n, there may be any number of positions to be equipped. The same applies between the Y21 and Y2n.

To minimise the Y path, the following rules are applied,
  (1) If the path (Y0, Y11) < the path (Y0, Y1n), the course will be from Y0 to Y11 ... Yn.
  (2) If the path (Y0, Y11) > the path (Y0, Y1n), the course will be from Y0 to Y1n ... Y11.
  (3) If the two paths are the same, consideration will be given to the situation on the X2 line.

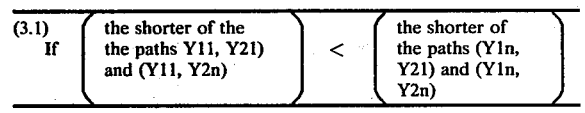

the course will be from Y0 to Y1n ... Y11.

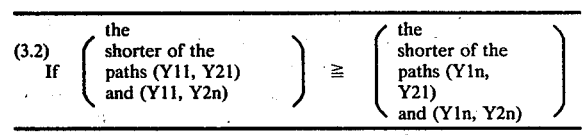

the course will be from Y0 to Y11 ... Y1n.

Bearing in mind the fact that after the X optimisation all the Y measurements on the same X line will already be in ascending order, the application of the foregoing rules will result either in all the Y measurements on the same X line being left in this order or in this order being reversed in the equipping sequence. The application of this Y optimisation to the example in FIG. 15A results in the Y measurements crossed through in table 15E being reversed. As a consequence of this optimisation, the devices are cut free and positioned in the order indicated by the cutting path shown in FIG. 15F.

Whilst the cutting sequence is being carried out, it is altered if at any given moment the reel 82 at the station which is supplying the devices 18 empties and if the monitor finds identical devices available at another station either to the right or left of the station which has emptied. To allow for this new situation, the part of the cutting sequence which has not yet been carried out is re-evaluated and re-optimised. In cases where the new station is to the left of the old one, the positions which it has not been possible to equip will be so equipped during the return phase of the table 52 before the soldering sequence. In all cases, the re-optimisation employs the same algorithm as was used for the first optimisation. This operation may be performed repeatedly with the single proviso that, during the return phase of the table 52, the monitor program must not look for a replacement cutting station to the right of that which has emptied.

After the cutting sequence has been completed, the monitor returns to the equipping plan (FIG. 15C) and, for each device to be soldered, looks for the address of a soldering station which has a soldering tool compatible with the category of the device. In the present example, all the devices 18 require the same soldering head, which is situated at station 1. The soldering sequence always takes place during the return phase of the table 52. The X positions will thus be defined on the return scale. By applying equation (2) in FIG. 17 with the address of station 1 a change is made from the equipment plan (FIG. 15C) to an un-optimised soldering sequence (15G). By applying the optimising algorithm to this sequence, an optimised soldering sequence (FIG. 15H) is obtained. To carry out the optimised sequence it is necessary to follow the soldering path indicated in (FIG. 15I).

The apparatus 40 which has just been described may be subject to many modifications. As an example, when associated with a circular substrate, the first reference system will preferably be a reference system employing polar co-ordinates. Similarly, the lines defining the second reference system associated with the cutting and soldering tools may be different and may be other than straight lines. In addition, the cutting and soldering may be performed with the same tool without exceeding the scope of the invention. This will be clearly apparent from the preceeding description.

Broadly speaking, the invention is in no way restricted to the embodiments described and illustrated and in fact covers all means which form technical equivalents of the means described, as well as combinations thereof, if these are within the scope of the invention and are made use of in the context of the following claims.

We claim:

1. Apparatus for mounting a plurality of devices onto a substrate, each of the devices being characterized within a first plurality of types according to its function and within a second plurality of categories in accordance with its dimensions, the substrate having a plurality of predetermined positions each for receiving a device of selected type and category, the devices being carried by and transported to the substrate by a flexible supporting element, said apparatus comprising:
a chassis,
a first plurality of cutting tools mounted on said chassis, each for cutting a device from its support element;
a second plurality of attaching tools mounted on said chassis, each for attaching a device to a preselected position of the substrate;
said first plurality of cutting tools and second plurality of attaching tools being arranged on said chassis with respect to a first reference line;
means on said chassis for conveying devices of each type to a corresponding cutting tool and devices of each category to a corresponding attaching tool;
a movable table on said chassis having a plate for supporting the substrate;
moving means for moving said table and said plate with respect to said first reference line; and
control means operably connected to said moving means, said cutting tools and said attaching tools for controlling said moving means to move said table and said plate so as to be correctly positioned with respect to a corresponding one of said cutting tools and a corresponding one of said attaching tools, and for actuating said corresponding one cutting tool and said corresponding one attaching tool when the preselected position of the substrate is accurately aligned with respect to each of said corresponding one cutting tool and said corresponding one attaching tool.

2. Apparatus according to claim 1, including a reel mounted to said chassis, the flexible supporting element being rolled up on the reel, said reel being arranged to feed flexible supporting element and the devices carried thereon to one of said cutting tools, and further including means connected to said control means for advancing incrementally said flexible supporting element in a manner to bring each device on said supporting element successively into line with said one cutting tool.

3. Apparatus according to claim 2, wherein said supporting element contains marks associated with those devices that are faulty, and said apparatus further includes means responsive to the presence of said marks for actuating said advancing means to move said supporting element and faulty device corresponding to the mark past said cutting tool so that it will not be mounted upon the substrate.

4. Apparatus according to claim 2, wherein there is included positioning means associated with said table comprised of slotted means disposed in a fixed relationship with respect to the substrate for defining a plurality of slots, and mobile means including a source of radiation and a radiation sensor sensitive to radiation directed from said source through one of said slots.

5. Apparatus according to claim 4, wherein said slotted means comprises a first member for defining a plurality of slots and coupled to one of said tools, and said mobile means is coupled to said plate.

6. Apparatus according to claim 5, wherein said slotted means comprises a second member having a plurality of slots therein and coupled to said table and said mobile means comprises a second radiation source and a second radiation sensor for receiving radiation directed through at least one of said slots of said second member, each of said second radiation source and said second sensor means coupled to said plate.

7. Apparatus to claim 5, wherein said sensor means comprises first and second adjoining radiation receiving areas separated from each other and disposed upon either side of a line which is parallel to the length of said slots of said member.

8. Apparatus according to claim 4, wherein said control means includes means for counting the slots in the said member in response to the output of said sensor means.

9. Apparatus according to claim 1, wherein said moving means comprises first and second electric motors coupled to said table and to said plate, respectively.

10. Apparatus according to claim 1, wherein said control means includes means for monitoring the force exerted by said cutting and attaching tools.

11. Apparatus according to claim 10, wherein said means for monitoring comprises force measuring means, and flexible means having its first end connected to a transmission piece and its second end connected to one of said cutting and attaching tools, said second end being connected to said force measuring means.

12. Apparatus according to claim 11, wherein said force measuring means comprises a sensor having a fixed part coupled to said transmission piece and a moving part coupled to said second end of said flexible means.

13. Apparatus according to claim 8 wherein said control means comprises means for monitoring the extent of travel of said cutting and attaching tools.

14. Apparatus according to claim 13, wherein said monitoring means comprises a sensor having a fixed part disposed in a fixed relation to one of said tools and having a moving part connected to said one tool.

15. Apparatus according to claim 1, wherein said plate comprises at least three members affixed to said plate and having rollers mounted rotatively thereon for receiving the substrate.

16. Apparatus according to claim 4, wherein said control means comprises means responsive to said sensor means for determining the minimum path of movement of the substrate to move each position of the substrate to receive a device at one of said cutting tools and to attach the device at one of said attaching tools.

17. Apparatus according to claim 2, wherein said control means comprises means for identifying the types and categories of devices supported by a supporting element as disposed upon one of said reels.

* * * * *

UNITED STATES PATENT AND TRADEMARK OFFICE
CERTIFICATE OF CORRECTION

PATENT NO. : 4,236,301

DATED : December 2, 1980

INVENTOR(S) : HUG et al.

It is certified that error appears in the above—identified patent and that said Letters Patent are hereby corrected as shown below:

In item [73] "Compagnie Internationale pour l'Informatique" should be -- Compagnie Internationale pour l'Informatique CII-Honeywell Bull (Societe Anonyme) --.

Signed and Sealed this

Seventh Day of April 1981

[SEAL]

Attest:

RENE D. TEGTMEYER

Attesting Officer     Acting Commissioner of Patents and Trademarks